US012588392B2

(12) United States Patent
Kim et al.

(10) Patent No.: US 12,588,392 B2
(45) Date of Patent: Mar. 24, 2026

(54) DISPLAY DEVICE

(71) Applicant: Samsung Display Co., Ltd., Yongin-si (KR)

(72) Inventors: Sunghoon Kim, Yongin-si (KR); Byunghoon Kang, Yongin-si (KR); Sanghoon Kim, Yongin-si (KR); Eunwon Seo, Yongin-si (KR); Jingyu Sim, Yongin-si (KR); Hyunji Lee, Yongin-si (KR); Taehyeog Jung, Yongin-si (KR); Seongjin Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 123 days.

(21) Appl. No.: 18/537,959

(22) Filed: Dec. 13, 2023

(65) Prior Publication Data

US 2024/0306471 A1 Sep. 12, 2024

(30) Foreign Application Priority Data

Mar. 7, 2023 (KR) ......................... 10-2023-0029651

(51) Int. Cl.
B32B 3/10 (2006.01)
B32B 3/16 (2006.01)
(Continued)

(52) U.S. Cl.
CPC .............. H10K 59/871 (2023.02); B32B 3/10 (2013.01); B32B 3/16 (2013.01); B32B 3/22 (2013.01)

(58) Field of Classification Search
CPC .... B32B 3/10; B32B 3/16; B32B 3/22; B32B 7/12; G06F 1/1616; G06F 1/1641; G06F 1/1652; H01K 77/111
See application file for complete search history.

(56) References Cited

U.S. PATENT DOCUMENTS 10,694,625 B2    6/2020    Park et al.
11,334,117 B2    5/2022    Youn et al.
(Continued)

FOREIGN PATENT DOCUMENTS

CN    112099260    12/2020
CN    114913773    8/2022
(Continued)

OTHER PUBLICATIONS

Ryan L. Truby et al. "Distributed Proprioception of 3D Configuration in Soft, Sensorized Robots via Deep Learning", IEEE Robotics and Automation Letters, vol. 5, No. 2, pp. 3299-3306, Apr. 2020 (Total 8 pages).

*Primary Examiner* — Elizabeth E Mulvaney
(74) *Attorney, Agent, or Firm* — Sughrue Mion, PLLC

(57) ABSTRACT

A display device includes a display panel, and a pattern glass disposed on the display panel and including a first non-pattern portion, a pattern portion, and a second non-pattern portion, which are arranged in a first direction. The pattern portion includes a plurality of patterns having a shape and arranged in the first direction and a second direction intersecting the first direction, and openings defined through the pattern glass between the plurality of patterns adjacent to each other. Each of the openings has a symmetrical shape with respect to a third direction intersecting a plane defined by the first and second directions based on a symmetry axis extending in the second direction. The symmetry axis passes through a midpoint of a thickness of the pattern glass.

21 Claims, 32 Drawing Sheets

(51) Int. Cl.
    *B32B 3/22*         (2006.01)
    *H10K 59/80*      (2023.01)

(56)            References Cited

U.S. PATENT DOCUMENTS

| | | | |
|---|---|---|---|
| 11,508,268 | B2 | 11/2022 | Lee et al. |
| 11,627,679 | B2 | 4/2023 | Sunwoo et al. |
| 11,672,084 | B2 | 6/2023 | Ha et al. |
| 2010/0033818 | A1 | 2/2010 | Petcavich et al. |
| 2022/0091637 | A1 | 3/2022 | Kuon et al. |
| 2022/0183174 | A1 | 6/2022 | Bae et al. |
| 2022/0198964 | A1* | 6/2022 | Cho ........................ G06F 1/1637 |
| 2022/0198965 | A1 | 6/2022 | Yeon et al. |
| 2022/0199921 | A1* | 6/2022 | Kim ........................ G06F 1/1652 |
| 2022/0374046 | A1 | 11/2022 | Kim et al. |
| 2022/0376192 | A1 | 11/2022 | Kim et al. |
| 2022/0376201 | A1* | 11/2022 | Kim ........................ H10K 71/00 |
| 2022/0404869 | A1* | 12/2022 | Kim ........................ G06F 1/1652 |
| 2023/0018777 | A1* | 1/2023 | Park ........................ G06F 1/1656 |
| 2024/0180018 | A1* | 5/2024 | Cho ........................ H10K 59/40 |

FOREIGN PATENT DOCUMENTS

| | | |
|---|---|---|
| EP | 3 955 092 | 2/2022 |
| KR | 10-2018-0039346 | 4/2018 |
| KR | 10-2019-0049454 | 5/2019 |
| KR | 10-2020-0053234 | 5/2020 |
| KR | 10-2020-0069799 | 6/2020 |
| KR | 10-2167404 | 10/2020 |
| KR | 10-2021-0103027 | 8/2021 |
| KR | 10-2022-0039967 | 3/2022 |
| KR | 10-2395734 | 5/2022 |
| KR | 10-2022-0158890 | 12/2022 |

\* cited by examiner

VII

VII'

DR2

DR1

DR3

DISPLAY DEVICE

CROSS-REFERENCE TO RELATED APPLICATION(S)

This U.S. non-provisional patent application claims priority to Korean Patent Application No. 10-2023-0029651 under 35 U.S.C. § 119, filed on Mar. 7, 2023 in the Korean Intellectual Property Office, the entire contents of which are incorporated herein by reference.

BACKGROUND

1. Technical Field

The disclosure relates to a display device.

2. Description of the Related Art

An electronic device displays various images through a display screen to provide a user with information. In general, the electronic device displays the information in an allocated screen area. In recent years, flexible electronic devices including a flexible display panel that is foldable are being developed. Different from a rigid electronic device, the flexible electronic device is foldable, rollable, or bendable. The flexible electronic device, which is capable of being transformed into various shapes, is more readily carried and improves a user's convenience.

The electronic device includes a display panel and a window disposed on the display panel and protecting the display panel. The window includes a plurality of patterns to secure flexibility of the flexible electronic device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device including a pattern glass having improved impact resistance, being readily folded, and preventing a moiré phenomenon.

Embodiments of the disclosure provide a display device that may include a display panel and a pattern glass disposed on the display panel and including a first non-pattern portion, a pattern portion, and a second non-pattern portion, which are arranged in a first direction. The pattern portion may include a plurality of patterns having a shape and arranged in the first direction and a second direction intersecting the first direction, and openings defined through the pattern glass between the plurality of patterns adjacent to each other. Each of the openings may have a symmetrical shape with respect to a third direction intersecting a plane defined by the first and second directions based on a symmetry axis extending in the second direction, and the symmetry axis may pass through a midpoint of a thickness of the pattern glass.

The openings may have a shape corresponding to the plurality of patterns in a plan view.

The plurality of patterns may have a same shape and may be repeatedly arranged. The plurality of patterns may not be separated from each other.

The plurality of patterns may have at least one of a cross-like shape, a snow crystal shape, a scale shape, a pinwheel shape, a spiral shape, an octagonal shape, and a column shape.

The openings may have a straight line shape alternately extending in the first direction and the second direction in a plan view. Each of the openings may have a width within a range of about 5 micrometers to about 10 micrometers.

The plurality of patterns may have a spiral shape in a plan view. The openings may have a curved shape in a plan view.

The plurality of patterns may have wave patterns arranged in a plurality of rows. The plurality of rows may correspond to the second direction.

Each of the wave patterns may have a length within a range of about 0.625 mm to about 1.125 mm in the second direction. Lengths in the second direction of the wave patterns may be different from each other.

A distance between the wave patterns adjacent to each other in the second direction may be within a range of about 10 micrometers to about 200 micrometers. Distances between the wave patterns adjacent to each other may be different from each other.

The wave patterns adjacent to each other in the second direction may have different wavelengths from each other.

At least one wave pattern among the wave patterns may have a uniform wavelength.

Wavelengths of the wave patterns may vary.

Inner side surfaces of the pattern portion may be defined by surfaces of the plurality of patterns facing each other to define the openings. The inner side surfaces of the pattern portion may have a straight line shape extending in the third direction when viewed in the first direction.

Inner side surfaces of the pattern portion may be defined by surfaces of the plurality of patterns facing each other to define the openings. The inner side surfaces of the pattern portion may have a convex shape toward the openings when viewed in the first direction.

The pattern portion may further include first slant surfaces connecting the inner side surfaces of the pattern portion and an upper surface of the pattern portion when viewed in the first direction, and second slant surfaces connecting the inner side surfaces of the pattern portion and a lower surface of the pattern portion when viewed in the first direction.

The openings may have a tapered shape in which a width of the openings increases from a midpoint of a thickness of the pattern portion to an upper surface or a lower surface of the pattern portion when viewed in the first direction.

Embodiments of the disclosure provide a display device that may include a display panel, and a pattern glass disposed on the display panel and including a first non-pattern portion, a pattern portion, and a second non-pattern portion, which are arranged in a first direction. The pattern portion may include a plurality of patterns having a shape, arranged in a second direction intersecting the first direction in a plan view, and having a wave pattern, and openings defined through the pattern glass between the plurality of patterns adjacent to each other in the second direction. The plurality of patterns which have the wave pattern may have different amplitudes from each other in a plan view.

Each of the openings may have a symmetrical shape with respect to a third direction intersecting a plane defined by the first and second directions based on a symmetry axis extending in the second direction.

At least one pattern of the plurality of patterns may have a uniform wavelength and extend in the first direction.

A first amplitude value may vary from a second amplitude value in each of the plurality of patterns.

According to the above, the pattern glass of the display device includes the multiple patterns overlapping a folding area. The openings, which have a shape corresponding to the plurality of patterns, are defined between the plurality of patterns adjacent to each other. The openings extend in the first and second directions. As the pattern glass of the display device has the structure described above, even though an external impact is applied to the pattern glass, the plurality of patterns are bent toward the openings in the first and second directions and absorb the external impact. Accordingly, the impact resistance of the pattern glass is improved.

According to the above, the openings are defined through the pattern glass of the display device. The openings penetrate the pattern glass. A length in the third direction of inner side surfaces of the plurality of patterns, which define the openings, increases. Due to the structure describe above, a resistance of the pattern glass against a folding operation is reduced, and the pattern glass is readily folded.

According to the above, the pattern glass of the display device includes multiple patterns arranged in the second direction. Each of the patterns includes a wave pattern. The wave patterns have different wavelengths or altitudes from each other. For example, the patterns having shapes different from each other are arranged. Due to the structure, a moiré phenomenon of the display device is prevented.

BRIEF DESCRIPTION OF THE DRAWINGS

The above and other advantages of the disclosure will become readily apparent by reference to the following detailed description when considered in conjunction with the accompanying drawings wherein:

FIGS. 17A to 17D are schematic views illustrating a method of manufacturing a pattern glass shown in FIGS. 13A and 13B.

DETAILED DESCRIPTION OF THE EMBODIMENTS

Figure 1:
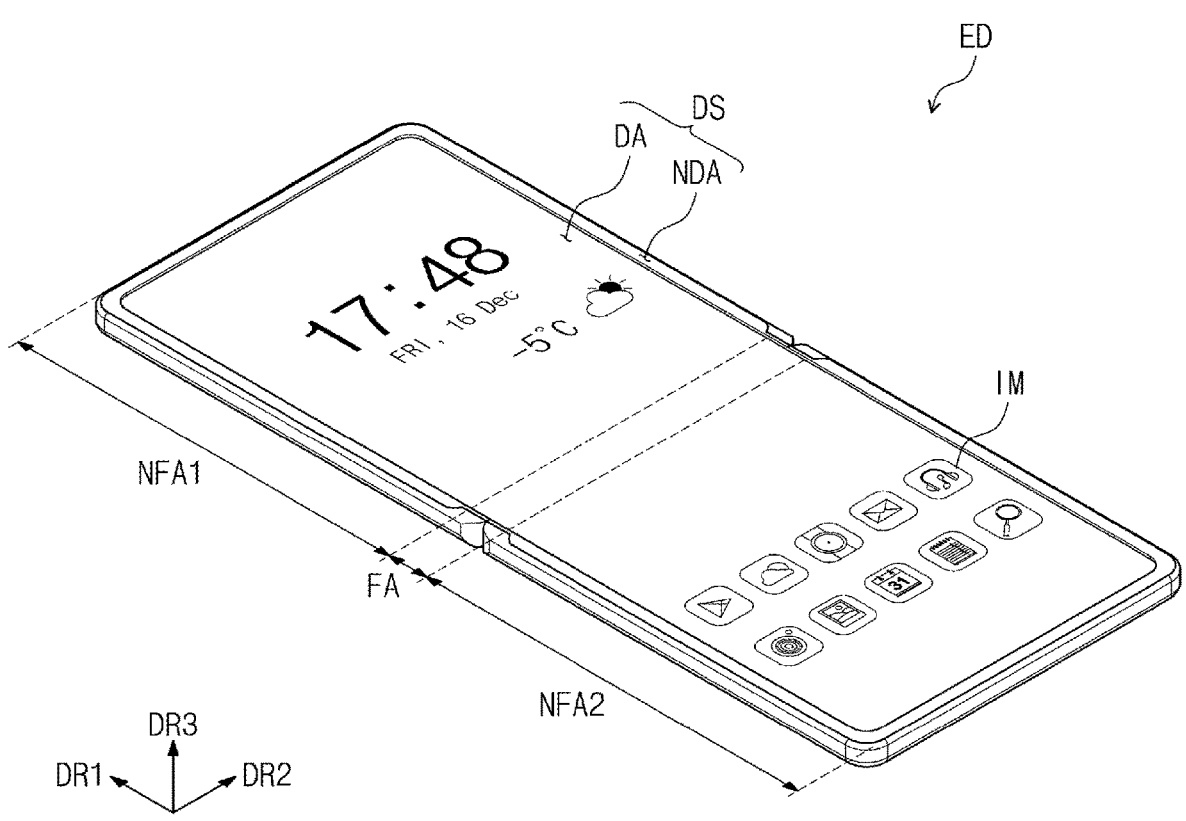
FIG. 1 is a schematic perspective view of an electronic device according to an embodiment of the disclosure.

Features of the disclosure and methods of accomplishing the same may be understood more readily by reference to the following detailed description of embodiments and the accompanying drawings. The disclosure may, however, be embodied in many different forms and should not be construed as being limited to the embodiments set forth herein. Rather, these embodiments are provided so that this disclosure will be thorough and complete and will fully convey the disclosure to those skilled in the art. Like reference numerals denote like elements throughout the specification.

As used herein, the singular forms, "a," "an," and "the" are intended to include the plural forms as well, unless the context clearly indicates otherwise.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In the disclosure, it will be understood that when an element or layer is referred to as being "on", "connected to" or "coupled to" another element or layer, it can be directly on, connected or coupled to the other element or layer or intervening elements or layers may be present.

As used herein, the term "and/or" includes any and all combinations of one or more of the associated listed items. For example, "A and/or B" may be understood to mean any combination including "A, B, or A and B." The terms "and" and "or" may be used in the conjunctive or disjunctive sense and may be understood to be equivalent to "and/or."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

Embodiments described in the disclosure are described with reference to plan views and cross-sectional views that are ideal schematic diagrams. Accordingly, shapes of the views may vary depending on manufacturing technologies and/or tolerances. Thus, embodiments are not limited to shown specific forms and also include variations in form produced according to manufacturing processes. Therefore, regions illustrated in the drawings are merely examples, and the shapes of the regions illustrated in the drawings are intended to illustrate the specific shapes of the regions of elements and not to limit the scope of the disclosure.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
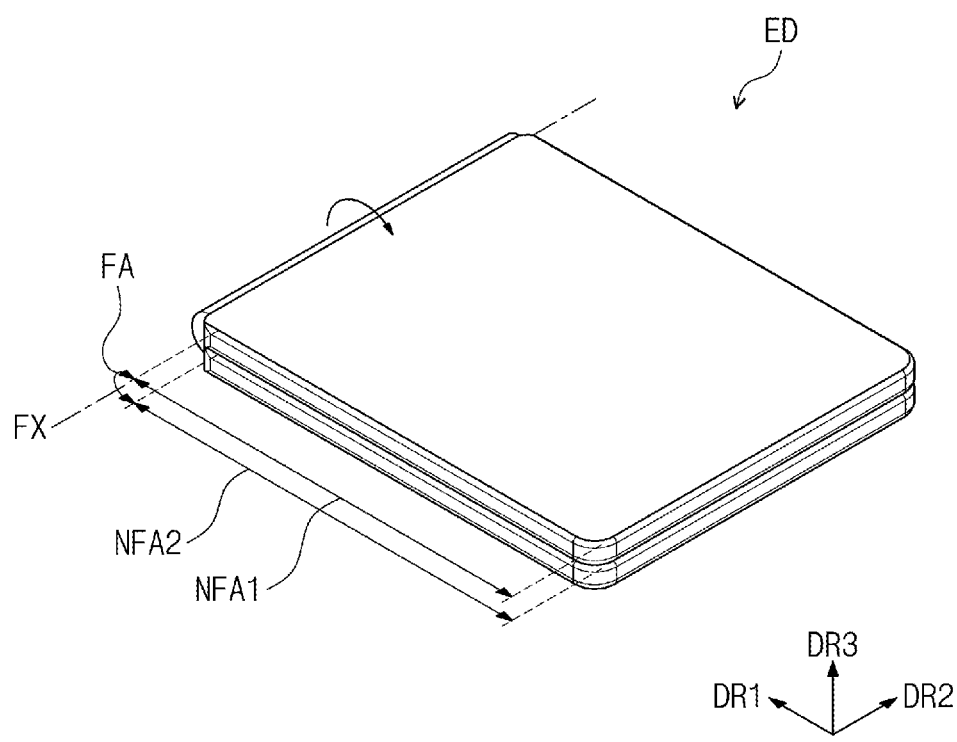
FIG. 2 is a schematic perspective view of a folded state of the electronic device shown in FIG. 1.

FIG. 1 is a schematic perspective view of an electronic device ED according to an embodiment of the disclosure. FIG. 2 is a schematic perspective view of a folded state of the electronic device ED shown in FIG. 1.

Referring to FIG. 1, the electronic device ED may have a rectangular shape defined by long sides extending in a first direction DR1 and short sides extending in a second direction DR2 intersecting the first direction DR1. However, the shape of the electronic device ED should not be limited to the rectangular shape, and the electronic device ED may have various shapes, such as a circular shape and a polygonal shape. The electronic device ED may be a flexible display device.

Hereinafter, a direction perpendicularly intersecting a plane defined by the first and second directions DR1 and DR2 is referred to as a third direction DR3. In the disclosure, the expression "in a plan view" may mean a state of being viewed in the third direction DR3. In addition, in the disclosure, the expression "overlap" may refer to a state in which components are arranged to overlap each other in a plan view.

The electronic device ED may include a folding area FA and multiple non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The first non-folding area NFA1, the folding area FA, and the second non-folding area NFA2 may be arranged in the first direction DR1.

In an embodiment, one folding area FA and two non-folding areas NFA1 and NFA2 are shown as a representative example, however, the number of the folding areas FA and the number of non-folding areas NFA1 and NFA2 should not be limited thereto or thereby. As an example, the electronic device ED may include more than two non-folding areas and multiple folding areas disposed between the non-folding areas.

An upper surface of the electronic device ED may be referred to as a display surface DS, and the display surface DS may be a plane defined by the first direction DR1 and the second direction DR2. Images IM generated by the electronic device ED may be provided to a user through the display surface DS.

The display surface DS may include a display area DA and a non-display area NDA around the display area DA. The display area DA may display the image, and the non-display area NDA may not display the image. The non-display area NDA may surround the display area DA and may define an edge of the electronic device ED, which is printed by a predetermined or selected color.

Although not shown in figures, the electronic device ED may include sensors and at least one camera.

Referring to FIG. 2, the electronic device ED may be a foldable electronic device ED that is folded or unfolded. As an example, the folding area FA may be bent with respect to a folding axis FX substantially parallel to the second direction DR2, and thus, the electronic device ED may be folded. The folding axis FX may be defined as a minor axis substantially parallel to the short sides of the electronic device ED.

In case that the electronic device ED is folded, the electronic device ED may be inwardly folded (in-folding) such that the first non-folding area NFA1 and the second non-folding area NFA2 may face each other and the display surface DS may not be exposed to the outside. However, the disclosure should not be limited thereto or thereby. As an example, the electronic device ED may be outwardly folded (out-folding) with respect to the folding axis FX such that the display surface DS may be exposed to the outside.

Figure 3:
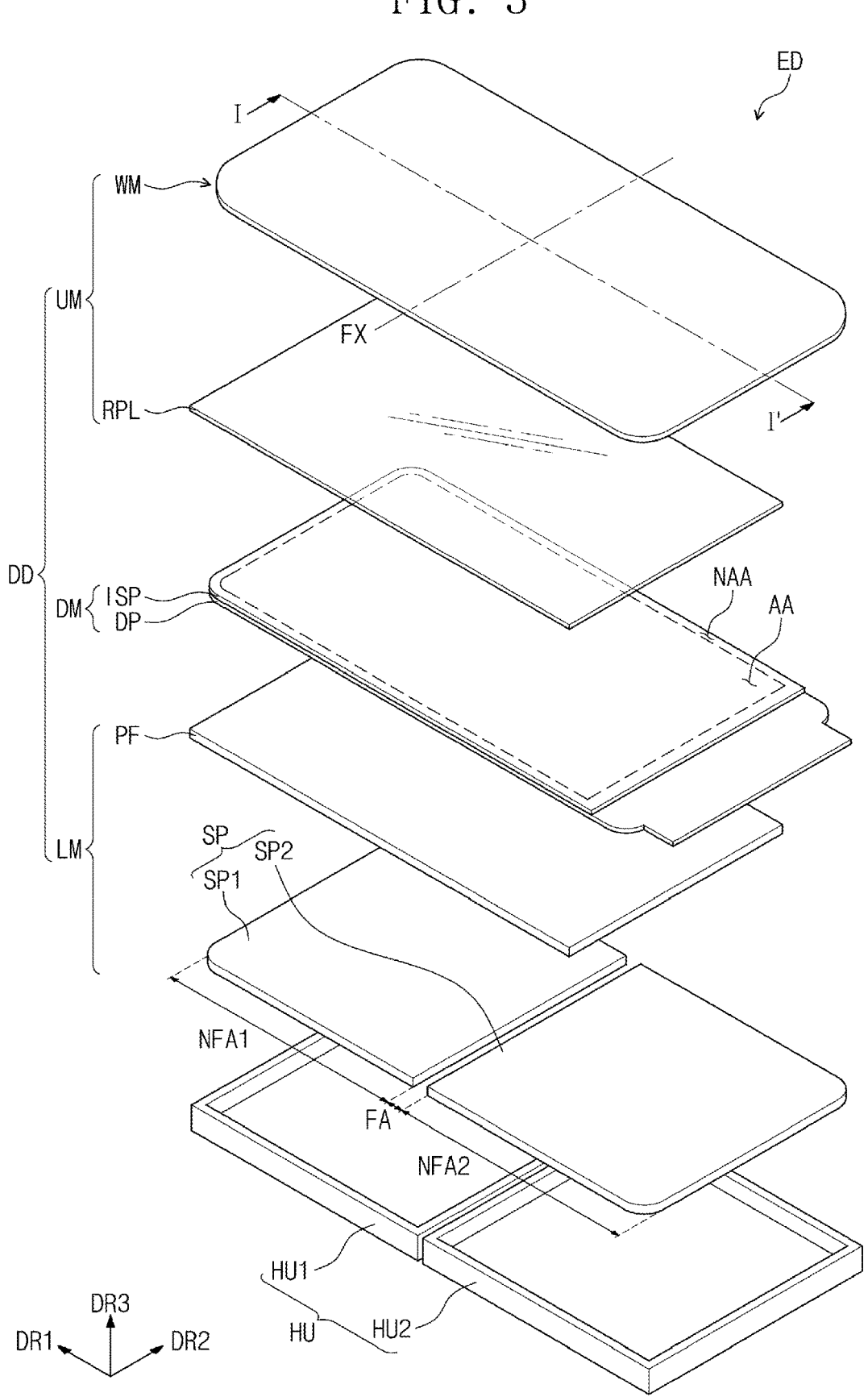
FIG. 3 is an exploded schematic perspective view of an electronic device according to an embodiment of the disclosure.
Figure 4:
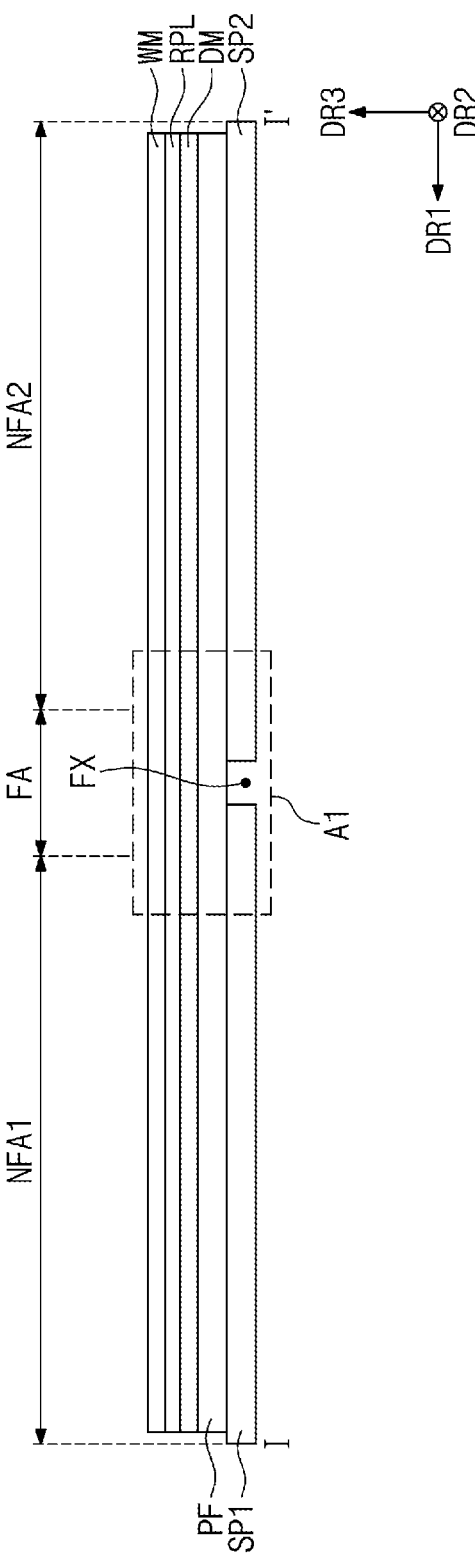
FIG. 4 is a schematic cross-sectional view taken along line I-I' of FIG. 3.

FIG. 3 is an exploded schematic perspective view of the electronic device ED according to an embodiment of the disclosure. FIG. 4 is a schematic cross-sectional view taken along line I-I' of FIG. 3.

Referring to FIG. 3, the electronic device ED may include a display device DD and a housing HU. Although not shown in figures, the electronic device ED may further include a mechanical structure to control a folding operation of the display device DD.

The display device DD may include a display module DM displaying the image, an upper module UM disposed on the display module DM, and a lower module LM disposed under the display module DM. The display module DM may serve as a part of the display device DD, and particularly, the image may be generated by the display module DM. The display module DM may generate the image in response to electrical signals and may transmit/receive information about an external input. The display module DM may include an active area AA and a peripheral area NAA. The active area AA may be defined as an area through which the image provided from the display module DM transmits.

The peripheral area NAA may be defined adjacent to the active area AA. For example, the peripheral area NAA may surround the active area AA. However, this is merely an example, and the peripheral area NAA may be defined in various shapes and should not be particularly limited. According to an embodiment, the active area AA of the display module DM may overlap at least a portion of the display area DA of FIG. 1.

The display module DM may include a display panel DP and an input sensing unit ISP. The display panel DP may be a light emitting type display panel, however, it should not be particularly limited. For instance, the display panel DP may be an organic light emitting display panel, an inorganic light emitting display panel, or a quantum dot light emitting display panel. A light emitting layer of the organic light emitting display panel may include an organic light emitting material, and a light emitting layer of the inorganic light emitting display panel may include an inorganic light emitting material. A light emitting layer of the quantum dot light emitting display panel may include a quantum dot or a quantum rod. Hereinafter, the organic light emitting display panel will be described as a representative example of the display panel DP.

The display panel DP may be a flexible display panel. Accordingly, the display panel DP may be entirely rolled or may be folded or unfolded about the folding axis FX.

The input sensing unit ISP may be disposed directly on the display panel DP. According to an embodiment, the input sensing unit ISP may be formed on the display panel DP through successive processes. For example, in case that the input sensing unit ISP is disposed directly on the display panel DP, an adhesive film may not be disposed between the input sensing unit ISP and the display panel DP, however, the disclosure should not be limited thereto or thereby. The adhesive film may be disposed between the input sensing unit ISP and the display panel DP. The input sensing unit ISP may not be manufactured together with the display panel DP through the successive processes. For example, the input sensing unit ISP may be fixed to an upper surface of the display panel DP by the adhesive film after being manufactured through a separate process.

The display panel DP may generate the image, and the input sensing unit ISP may obtain coordinate information about the user input, e.g., a touch event.

The upper module UM may include a window WM disposed on the display module DM. The window WM may include an optically transparent insulating material. Therefore, the user may readily view the image generated by the display module DM through the window WM. The window WM will be described in detail with reference to FIG. 7.

The upper module UM may further include one or more functional layers disposed between the display module DM and the window WM. As an example, the functional layer may be an anti-reflective layer RPL that prevents a reflection of an external light.

The anti-reflective layer RPL may prevent components included in the display module DM from being perceived from the outside due to the external light incident through a front surface of the display device DD. The anti-reflective layer RPL may include a retarder and a polarizer. The retarder may be a film type or liquid crystal coating type and may include a $\lambda/2$ retarder and/or a $\lambda/4$ retarder. The polarizer may be a film type or liquid crystal coating type. The film type retarder and polarizer may include a stretching type synthetic resin film, and the liquid crystal coating type retarder and polarizer may include liquid crystals aligned in a predetermined or selected alignment. The retarder and the polarizer may be implemented as one polarizing film. The functional layer may further include a protective film disposed on or under the anti-reflective layer RPL.

The lower module LM may include a support plate SP disposed on a rear surface of the display module DM and supporting the display module DM and a protective film PF disposed between the display module DM and the support plate SP. The number of support plates SP may correspond to the number of non-folding areas NFA1 and NFA2. As an example, the support plate SP may include a first support plate SP1 and a second support plate SP2 disposed spaced apart from the first support plate SP1.

The first and second support plates SP1 and SP2 may be disposed to respectively correspond to the first and second non-folding areas NFA1 and NFA2. The first support plate SP1 may be disposed to overlap the first non-folding area NFA1 of the display module DM, and the second support plate SP2 may be disposed to overlap the second non-folding area NFA2 of the display module DM. Each of the first support plate SP1 and the second support plate SP2 may include a metal material or a plastic material.

In a case where the display module DM is in an unfolded state as shown in FIG. 1, the first and second support plates SP1 and SP2 may be disposed spaced apart from each other in the first direction DR1. In a case where the display module DM is in a folded state with respect to the folding axis FX as shown in FIG. 2, the first and second support plates SP1 and SP2 may be spaced apart from each other in the third direction DR3.

The first and second support plates SP1 and SP2 may be spaced apart from each other with respect to the folding area FA. The first and second support plates SP1 and SP2 may overlap a portion of the folding area FA. For example, a distance between the first and second support plates SP1 and SP2 in the first direction DR1 may be smaller than a width of the folding area FA.

Although not shown in FIGS. 3 and 4, the support plate SP may further include a connection module to connect the first and second support plates SP1 and SP2. The connection module may include a hinge module or a multi-joint module.

In an embodiment, the support plate SP includes two support plates SP1 and SP2, however, the number of the support plates is not be limited to two. For example, in case that multiple folding axis FX are provided, the support plate SP may include multiple support plates separated from each other with respect to the folding axes FX. The support plate SP may be provided in a single unitary plate without being separated into the first and second support plates SP1 and SP2. A bending portion may be provided in the support plate SP to correspond to the folding area FA. The bending portion may be provided with an opening defined through the support plate SP or may be provided with a recess recessed from a surface of the support plate SP.

The protective film PF may be disposed between the support plate SP and the display module DM. The protective film PF may be disposed under the display module DM and may protect the rear surface of the display module DM. The protective film PF may include a synthetic resin film, e.g., a polyimide film or a polyethylene terephthalate film, however, this is merely an example, and the protective film PF should not be limited thereto or thereby.

The housing HU may be coupled to the display device DD, particularly, the window WM to accommodate the display module DM and the lower module LM. The housing HU may include first and second housings HU1 and HU2 separated from each other, however, it should not be limited thereto or thereby. Although not shown in figures, the electronic device ED may further include a hinge structure to connect the first and second housings HU1 and HU2 to each other.

Figure 5:
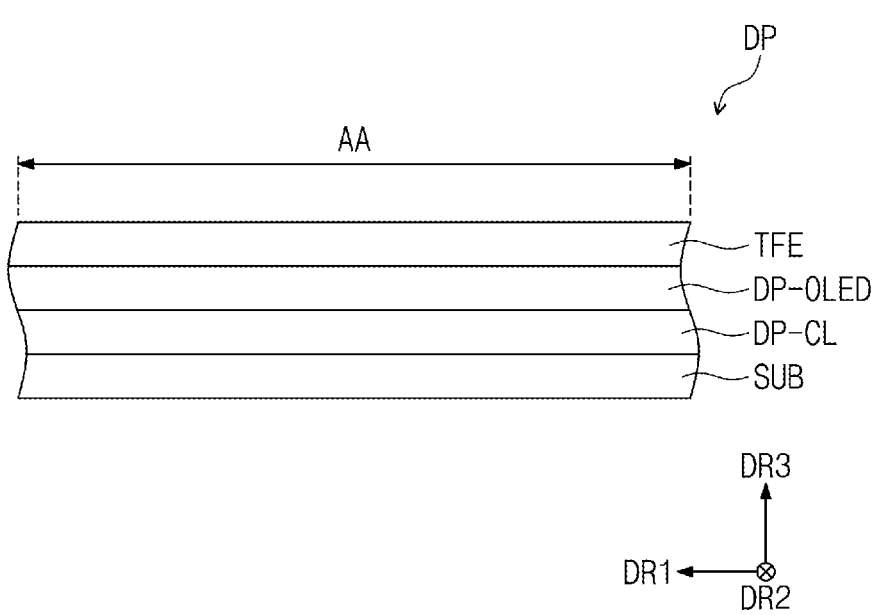
FIG. 5 is a schematic cross-sectional view of a display panel shown in FIG. 3.

FIG. 5 is a schematic cross-sectional view of the display panel DP shown in FIG. 3.

As an example, FIG. 5 shows a cross-section of the display panel DP when viewed in the first direction DR1.

Referring to FIG. 5, the display panel DP may include a substrate SUB, a circuit element layer DP-CL disposed on the substrate SUB, and a thin film encapsulation layer TFE disposed on the circuit element layer DP-CL.

The substrate SUB may include the active area AA and the peripheral area NAA around the active area AA. The substrate SUB may include a flexible plastic material such as polyimide (PI). A display element layer DP-OLED may be disposed in the active area AA.

Pixels PX may be disposed in the active area AA. Each pixel may include a transistor disposed in the circuit element layer DP-CL and a light emitting element disposed in the display element layer DP-OLED and connected to the transistor.

The thin film encapsulation layer TFE may be disposed on the circuit element layer DP-CL to cover the display element layer DP-OLED. The thin film encapsulation layer TFE may include inorganic layers and an organic layer disposed between the inorganic layers. The inorganic layers may protect the pixels PX from moisture and oxygen, and the organic layer may protect the pixels PX from a foreign substance such as dust particles.

Figure 6:
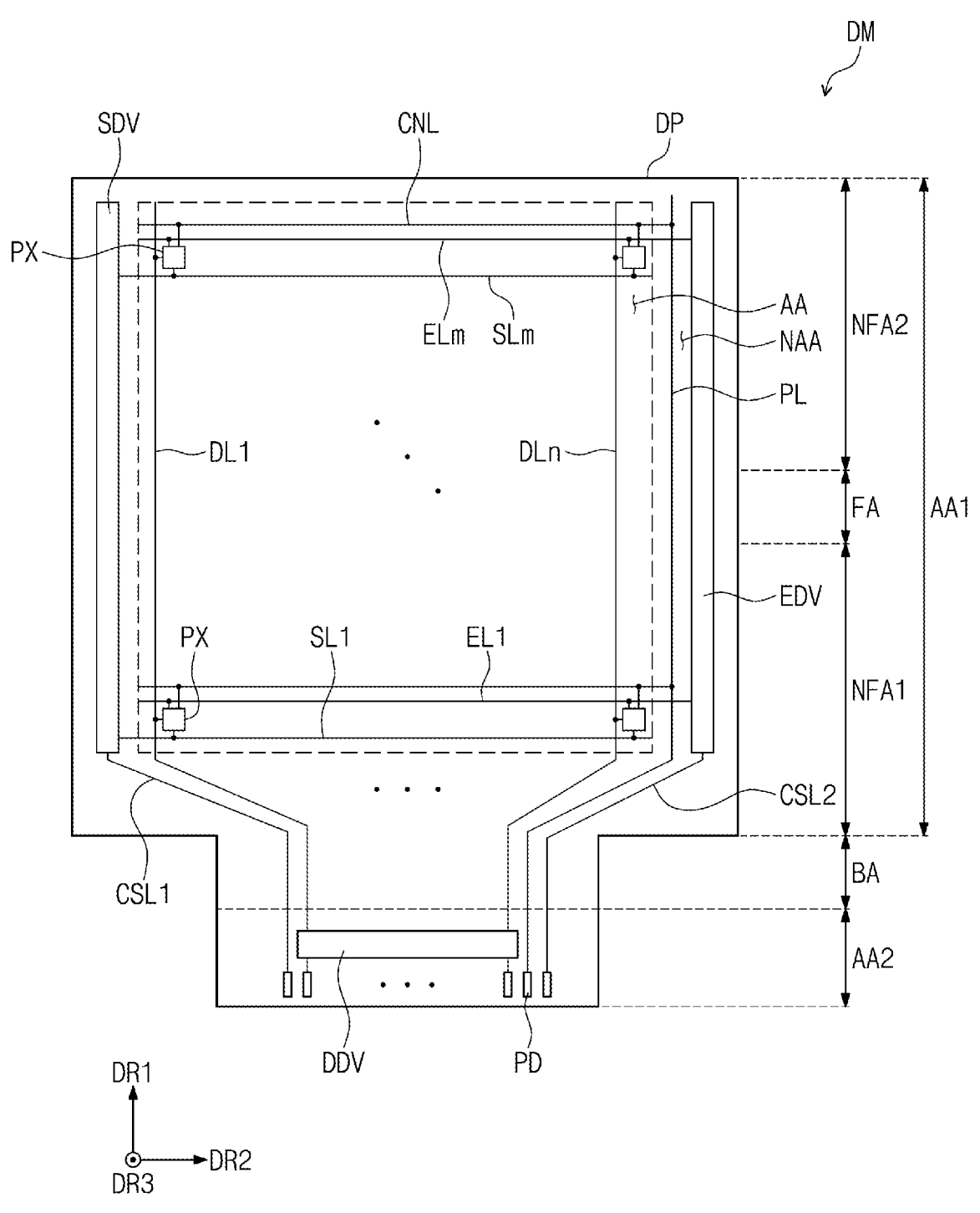
FIG. 6 is a schematic plan view of a display panel shown in FIG. 5.

FIG. 6 is a schematic plan view of the display panel shown in FIG. 5.

Referring to FIG. 6, the display module DM may include the display panel DP, a scan driver SDV, a data driver DDV, and an emission driver EDV.

The display panel DP may include a first area AA1, a second area AA2, and a bending area BA disposed between the first area AA1 and the second area AA2. The bending area BA may extend in the second direction DR2, and the first area AA1, the bending area BA, and the second area AA2 may be arranged in the first direction DR1.

The first area AA1 may include the active area AA and the peripheral area NAA around the active area AA. The peripheral area NAA may surround the active area AA. The active area AA may be an area in which an image is displayed, and the peripheral area NAA may be an area in which an image is not displayed. The second area AA2 and the bending area BA may be areas in which an image is not displayed.

When viewed in the second direction DR2, the first area AA1 may include the first non-folding area NFA1, the second non-folding area NFA2, and the folding area FA between the first non-folding area NFA1 and the second non-folding area NFA2.

The display panel DP may include the pixels PX, scan lines SL1 to SLm, data lines DL1 to DLn, emission lines EL1 to ELm, first and second control lines CSL1 and CSL2, a power line PL, connection lines CNL, and pads PD. Each of m and n is a natural number. The pixels PX may be arranged in the active area AA and may be connected to the scan lines SL1 to SLm, the data lines DL1 to DLn, and the emission lines EL1 to ELm.

The scan driver SDV and the emission driver EDV may be disposed in the peripheral area NAA. The scan driver SDV and the emission driver EDV may be disposed in the peripheral area NAA to be respectively adjacent to sides (e.g., both sides) of the first area AA1, which are opposite to each other in the second direction DR2. The data driver DDV may be manufactured in an integrated circuit chip form and may be mounted in the second area AA2.

The scan lines SL1 to SLm may extend in the second direction DR2 and may be connected to the scan driver SDV. The data lines DL1 to DLn may extend in the first direction DR1 and may be connected to the data driver DDV via the bending area BA. The emission lines EL1 to ELm may extend in the second direction DR2 and may be connected to the emission driver EDV.

The power line PL may extend in the direction parallel to the first direction DR1 and may be disposed in the peripheral area NAA. The power line PL may be disposed between the active area AA and the emission driver EDV, however, it should not be limited thereto or thereby. According to an embodiment, the power line PL may be disposed between the active area AA and the scan driver SDV.

The power line PL may extend to the second area AA2 via the bending area BA. In a plan view, the power line PL may extend to a lower end of the second area AA2. The power line PL may receive a driving voltage.

The connection lines CNL may extend in the second direction DR2 and may be arranged in the first direction DR1. The connection lines CNL may be connected to the power line PL and the pixels PX. The driving voltage may be applied to the pixels PX via the power line PL and the connection lines CNL connected to the power line PL.

The first control line CSL1 may be connected to the scan driver SDV and may extend toward the lower end of the second area AA2 via the bending area BA. The second control line CSL2 may be connected to the emission driver EDV and may extend toward the lower end of the second area AA2 via the bending area BA. The data driver DDV may be disposed between the first control line CSL1 and the second control line CSL2.

In a plan view, the pads PD may be disposed adjacent to the lower end of the second area AA2. The data driver DDV, the power line PL, the first control line CSL1, and the second control line CSL2 may be connected to the pads PD.

The data lines DL1 to DLn may be connected to corresponding pads PD via the data driver DDV. As an example, the data lines DL1 to DLn may be connected to the data driver DDV, and the data driver DDV may be connected to the pads PD respectively corresponding to the data lines DL1 to DLn.

Although not shown in figures, a printed circuit board may be connected to the pads PD, and a timing controller and a voltage generator may be disposed on the printed circuit board. The timing controller may be mounted on the printed circuit board after being manufactured in an integrated circuit chip form. The timing controller and the voltage generator may be connected to the pads PD via the printed circuit board.

The timing controller may control an operation of the scan driver SDV, the data driver DDV, and the emission driver EDV. The timing controller may generate a scan control signal, a data control signal, and an emission control signal in response to control signals applied thereto from the outside. The voltage generator may generate the driving voltage.

The scan control signal may be applied to the scan driver SDV via the first control line CSL1. The emission control signal may be applied to the emission driver EDV via the second control line CSL2. The data control signal may be applied to the data driver DDV. The timing controller may receive image signals from the outside, may convert a data format of the image signals to a data format appropriate to an interface between the timing controller and the data driver DDV, and may provide the converted image signals to the data driver DDV.

The scan driver SDV may generate scan signals in response to the scan control signal. The scan signals may be applied to the pixels PX via the scan lines SL1 to SLm. The scan signals may be sequentially applied to the pixels PX.

The data driver DDV may generate data voltages corresponding to the image signals in response to the data control signal. The data voltages may be applied to the pixels PX via the data lines DL1 to DLn. The emission driver EDV may generate emission signals in response to the emission control signal. The emission signals may be applied to the pixels PX via the emission lines EL1 to ELm.

The pixels PX may receive the data voltages in response to the scan signals. The pixels PX may emit a light having a luminance corresponding to the data voltages in response to the emission signals, and thus, the image may be displayed. An emission time of the pixels PX may be controlled by the emission signals.

Figure 7:
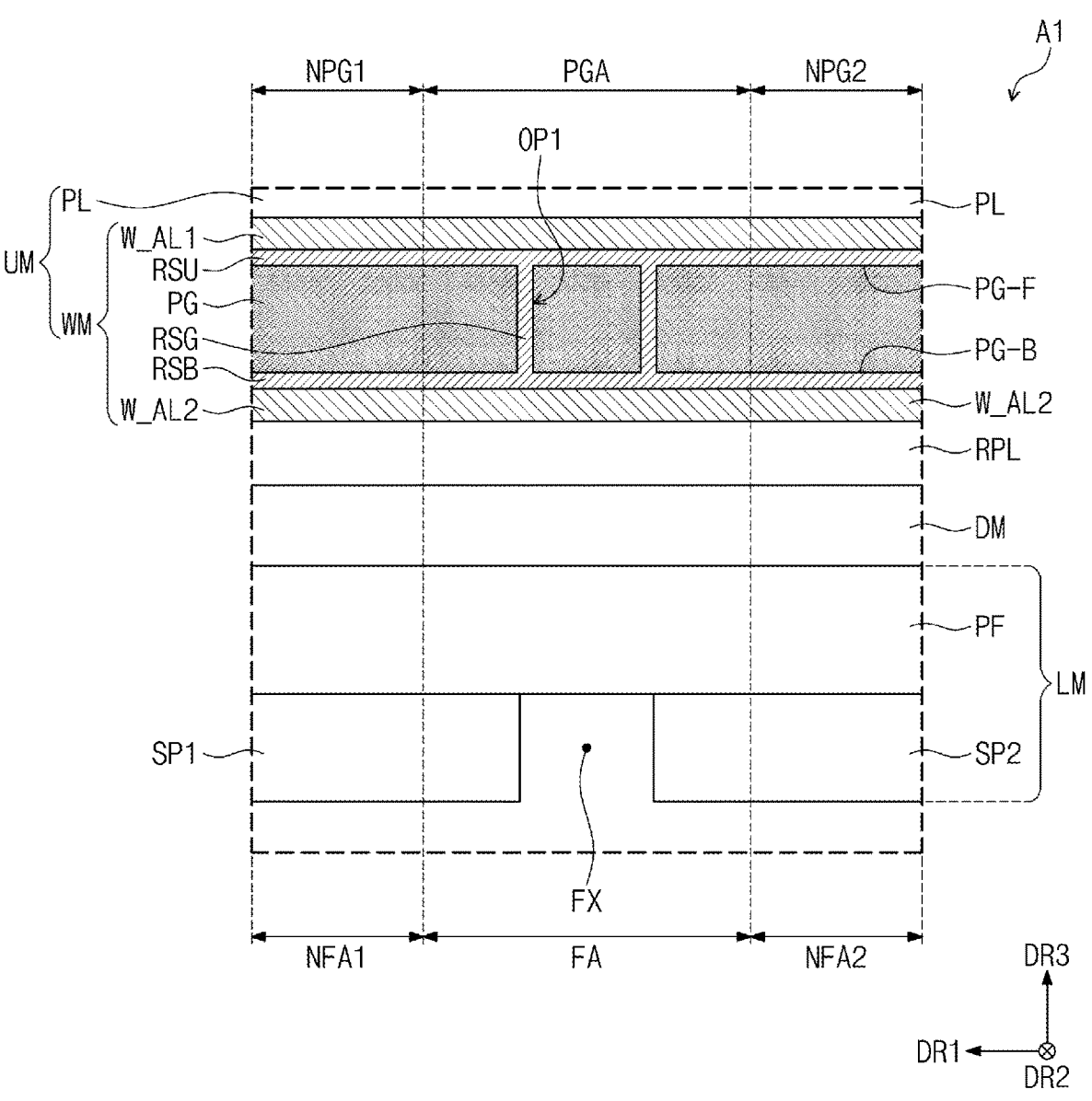
FIG. 7 is an enlarged schematic view of a first area Al of FIG. 4.
Figure 8A:
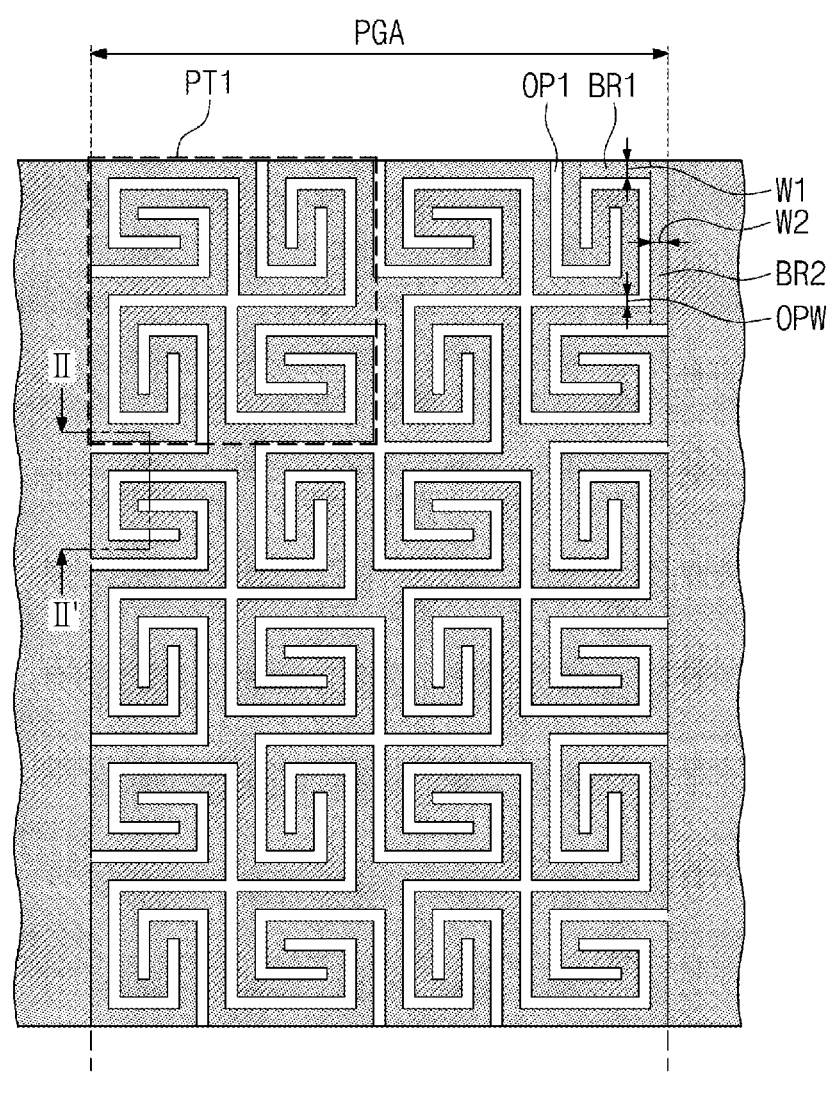
FIG. 8A is a schematic plan view of a pattern glass shown in FIG. 7.
Figure 8A:
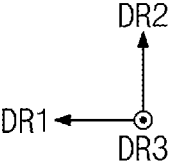
Figure 8B:
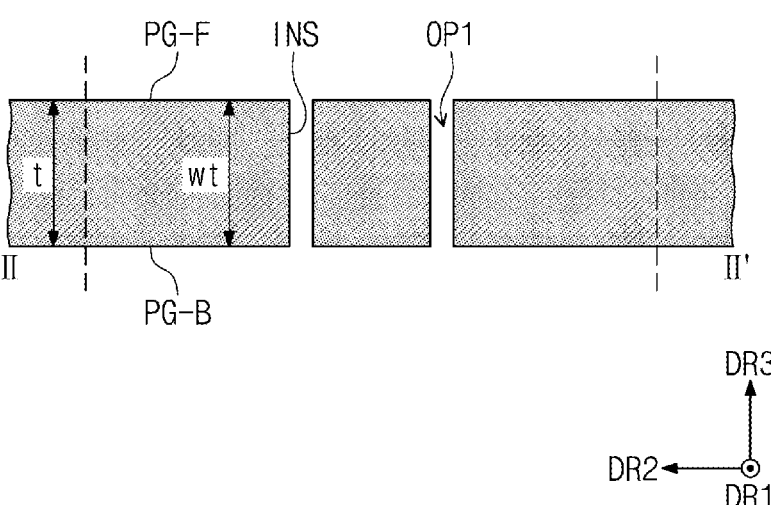
FIG. 8B is a schematic cross-sectional view taken along line I-I' shown in FIG. 8A.
Figure 9A:
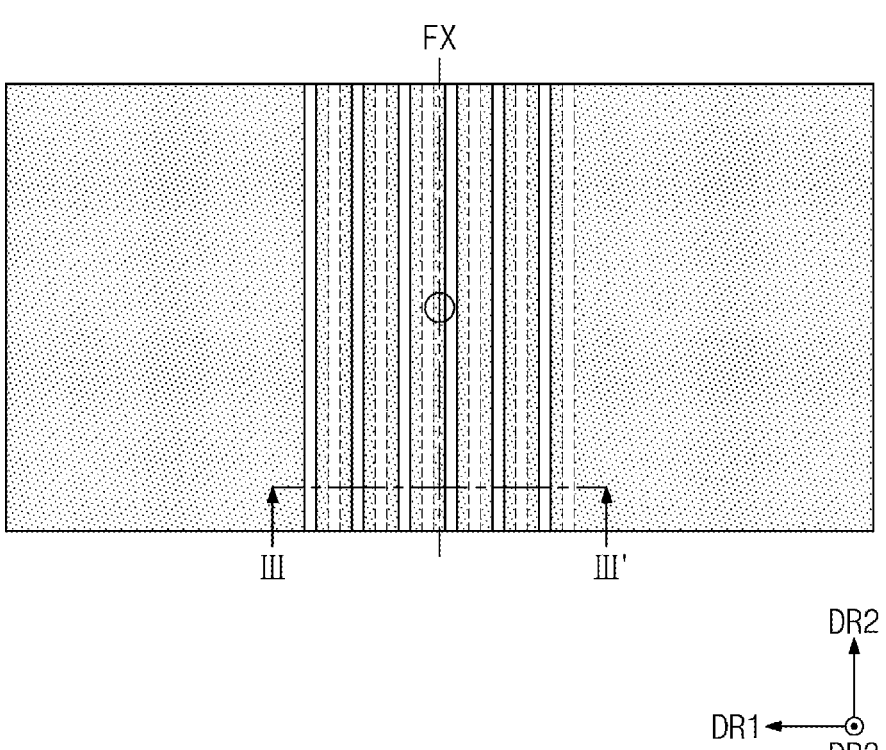
FIGS. 9A to 9C are schematic views of pattern glasses according to comparative examples.
Figure 9B:
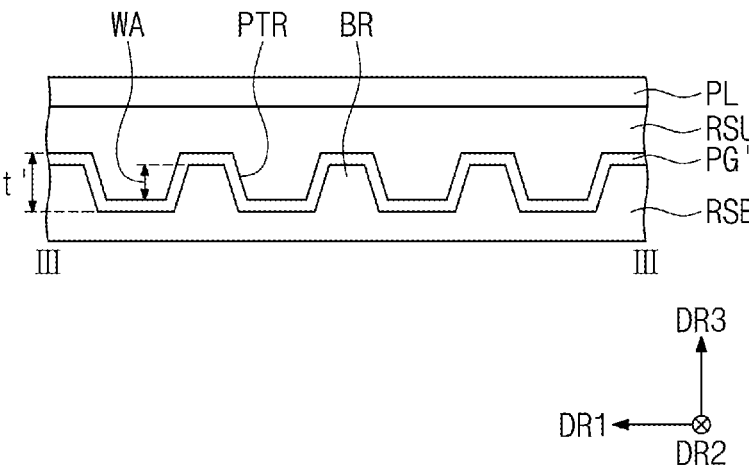
Figure 9C:
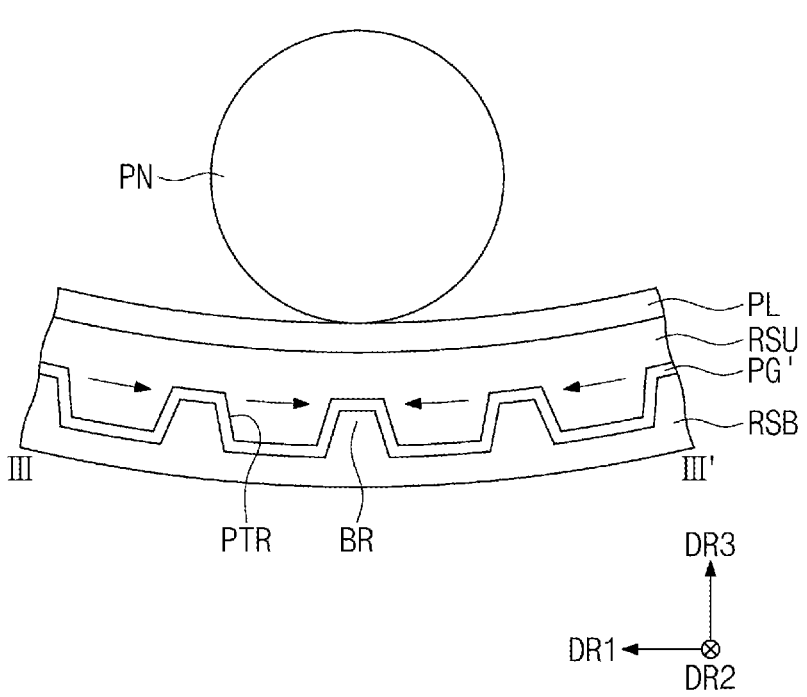
Figure 10:
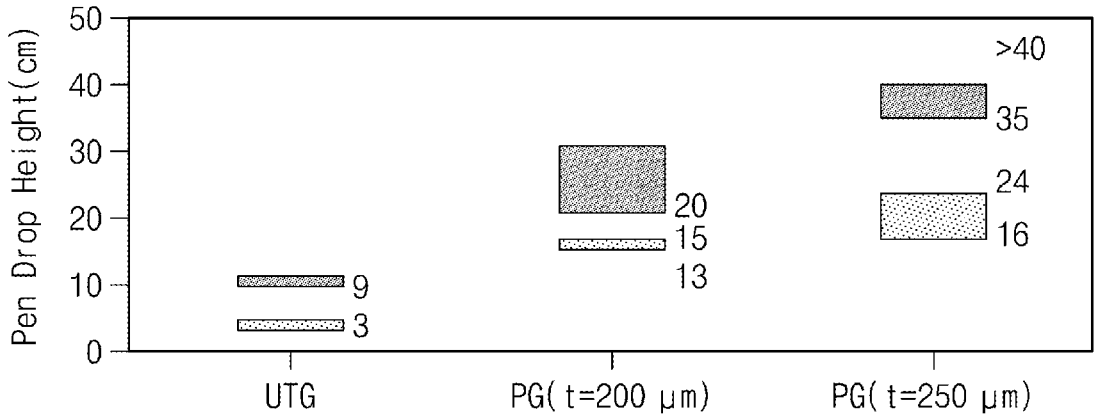
FIG. 10 is a schematic graph illustrating results of an impact resistance test of the pattern glass shown in FIGS. 7 to 8B and the pattern glasses according to the comparative examples.

FIG. 7 is an enlarged schematic view of a first area Al of FIG. 4. FIG. 8A is a schematic plan view of a pattern glass shown in FIG. 7. FIG. 8B is a schematic cross-sectional view taken along line II-II' shown in FIG. 8A. FIGS. 9A to 9C are schematic views of pattern glasses according to comparative examples. FIG. 10 is a schematic graph illustrating results of an impact resistance test of the pattern glass shown in FIGS. 7 to 8B and the pattern glasses according to the comparative examples.

As an example, FIG. 7 shows a cross-sectional view of the first area Al.

As an example, FIGS. 9B and 9C are cross-sectional views taken along line III-III' of FIG. 9A.

As an example, for the convenience of explanation, first and second window adhesive layers W_AL1 and W_AL2 of FIG. 7 are omitted in FIGS. 9B and 9C.

Since the first and second support plates SP1 and SP2, the anti-reflective layer RPL, the protective film PF, and the display module DM of FIG. 7 may be the same as the first and second support plates SP1 and SP2, the anti-reflective layer RPL, the protective film PF, and the display module DM of FIGS. 3 and 4, details thereof will be omitted or briefly described.

Referring to FIGS. 7, 8A, and 8B, the window WM may include the pattern glass PG, the first window adhesive layer W_AL1, the second window adhesive layer W_AL2, an upper resin layer RSU, a lower resin layer RSB, and a filling resin RSG.

The pattern glass PG may include a glass material. The pattern glass PG may include a pattern portion PGA and first and second non-pattern portions NPG1 and NPG2. The first non-pattern portion NPG1, the pattern portion PGA, and the second non-pattern portion NPG2 may be arranged in the first direction DR1. The pattern portion PGA may be disposed between the first and second non-pattern portions NPG1 and NPG2. The first non-pattern portion NPG1, the pattern portion PGA, and the second non-pattern portion NPG2 may be integral with each other (e.g., integrally formed with each other). As an example, the pattern glass PG may have a first thickness t from about 80 micrometers to about 250 micrometers, however, the first thickness t of the pattern glass PG should not be limited thereto or thereby. The first thickness t of the pattern glass PG may be determined according to folding characteristics.

The pattern portion PGA may overlap the folding area FA. The first non-pattern portion NPG1 may overlap the first non-folding area NFA1. The second non-pattern portion NPG2 may overlap the second non-folding area NFA2.

The pattern glass PG may include an upper surface PG-F and a lower surface PG-B. The upper surface PG-F and the lower surface PG-B may be two surfaces of the pattern glass PG, which are opposite to each other in third direction DR3.

Referring to FIGS. 7 and 8A, the pattern portion PGA may include patterns. The patterns may have a predetermined or selected shape. As an example, each first pattern PT1 may have a cross-like (cross) shape, hooked cross-like shape, tetragammadion-like shape, maze-like shape, or a shape having rotational symmetry in a plan view. Hereinafter, the cross-like shape may be defined as the first patterns PT1. In a plan view, the first patterns PT1 may be arranged in the first direction DR1 and the second direction DR2. The first patterns PT1, which have the same shape, may be arranged in a repeated manner The first patterns PT1 may not be separated from each other. The first patterns PT1 may be partially connected to each other.

In a plan view, each of the first patterns PT1 may include branch portions BR1 and BR2. The first branch portions BR1 may extend in the first direction DR1. The second branch portions BR2 may extend in the second direction DR2.

The first and second branch portions BR1 and BR2 of the first patterns PT1 may be alternately arranged with each other. As an example, the second branch portions BR2 may extend from sides of the first branch portions BR1, which are opposite to each other in the first direction DR1, or a side of the first branch portions BR1. The first branch portions BR1 may extend from sides of the second branch portions BR2, which are opposite to each other in the second direction DR2, or a side of the second branch portions BR2.

As an example, a width W1 in the second direction DR2 of the first branch portions BR1 may be about 90 micrometers, and a width W2 in the first direction DR1 of the second branch portions BR2 may be about 90 micrometers, however, the disclosure should not be limited thereto or thereby. The widths W1 and W2 of the first and second branch portions BR1 and BR2 may be determined according to the folding characteristics.

As an example, the first patterns PT1 are described as having the cross-like shape, however, they should not be limited thereto or thereby. The shape of the first patterns PT1 will be described in detail with reference to FIGS. 12A to 12F.

Openings may be defined between the branch portions BR1 and BR2 adjacent to each other. The openings defined in the first patterns PT1 may be defined as first openings OP1.

In a plan view, the first openings OP1 may have a shape corresponding to that of the first patterns PT1. As an example, the first openings OP1 may be defined between the first branch portions BR1 or between the second branch portions BR2 and may extend in the first direction DR1 and the second direction DR2. The first openings OP1 may have a straight line shape alternately extending in the first direction DR1 and the second direction DR2.

As an example, in a plan view, a distance between the first and second branch portions BR1 and BR2 adjacent to each other may be within a range of about 5 micrometers to about 10 micrometers. A distance between the first branch portions BR1 adjacent to each other and a distance between the second branch portions BR2 adjacent to each other may be within a range of about 5 micrometers to about 10 micrometers. For example, the first openings OP1 may have widths OPW each being within a range of about 5 micrometers to about 10 micrometers. However, the widths OPW of the first openings OP1 should not be limited thereto or thereby and may be determined according to the folding characteristics.

Referring to FIGS. 9A to 9C, as branch portions BR are bent to pattern recesses PTR defined in a pattern glass PG', the pattern glass PG' may absorb an external impact. In a case where the pattern recesses PTR of the pattern glass PG' are defined only in one direction of the first and second directions DR1 and DR2, the pattern glass PG' may be damaged in case that the external impact is applied to the pattern glass PG'.

As an example, the pattern recesses PTR may extend in the second direction DR2 and may be arranged in the first direction DR1 as shown in FIGS. 9A to 9C. In case that a pen PN is dropped on the pattern glass PG', the branch portions BR may be bent in the direction parallel to the first direction DR1. A width of each of the pattern recesses PTR may decrease. As the branch portions BR are bent in only one direction, the external impact may be dispersed in only one direction, and the pattern glass PG' and a display module DM shown in FIG. 7 may be damaged.

Referring to FIG. 8A, as the first openings OP1 extend in the first direction DR1 and the second direction DR2, the first and second branch portions BR1 and BR2 may be bent in the first and second directions DR1 and DR2 in case that the external impact is applied to the display module DM shown in FIG. 7 and the pattern glass PG. Accordingly, the first and second branch portions BR1 and BR2 may disperse an impact force in the first and second directions DR1 and DR2, and thus, an impact resistance of the pattern glass PG may be improved. Accordingly, the display module DM may be prevented from being damaged.

FIG. 10 shows results of an experimental example to evaluate the impact resistance. The experiment to evaluate the impact resistance may be carried out by a pen drop experiment. The pen drop experiment may be a test in which the pen is dropped on the electronic device ED of FIG. 7 from various heights. A y-axis represents the height at which the pen is dropped. An x-axis represents an ultra-thin glass (UTG) having a thickness of about 30 micrometers, a pattern glass PG having a thickness of about 200 micrometers, and a pattern glass PG having a thickness of about 250 micrometers.

In the case of the ultra-thin glass, the bright spot may occur in the display module DM in case that the pen is dropped at the height of about 3 cm. In case that the pen is dropped at the height of about 9 cm, the ultra-thin glass (UTG) and the display module DM may be damaged.

In the case of the pattern glass PG having the thickness of about 200 micrometers, the bright spot may occur in the display module DM in case that the pen is dropped at the height of about 13 cm to about 15 cm. In case that the pen is dropped at the height of about 20 cm or more, the pattern glass PG and the display module DM may be damaged.

In the case of the pattern glass PG having the thickness of about 250 micrometers, the bright spot may occur in the display module DM in case that the pen is dropped at the height of about 16 cm to about 24 cm. In case that the pen is dropped at the height of about 35 cm or more, the pattern glass PG and the display module DM may be damaged.

Accordingly, it is observed in the graph shown in FIG. 10 that the impact resistance of the pattern glass PG according to the disclosure is improved.

Referring to FIGS. 7 and 8B, inner side surfaces INS of the pattern portion PGA, which face each other to define the first openings OP1, may have a straight line shape extending in the third direction DR3 when viewed in the first direction DR1. The inner side surfaces INS of the pattern portion PGA may be defined as surfaces of the first patterns PT1 (refer to FIG. 8A), which face each other. However, the shape of the inner side surfaces INS should not be limited to the straight line shape. Various shapes of the inner side surfaces INS will be described in detail with reference to FIGS. 11A to 11C.

The first openings OP1 may extend in the third direction DR3 and may penetrate the pattern glass PG. Each of the first openings OP1 may have a shape symmetrical with respect to a symmetry axis extending in the second direction DR2 and passing through a midpoint, e.g., a ½ point, of a thickness of the pattern glass PG.

Referring to FIGS. 1, 2, and 9B, as a length WA in the third direction DR3 of inner side surfaces of the pattern glass PG' decreases, the electronic device ED shown in FIGS. 1 and 2 may not be readily folded.

In detail, in case that the electronic device ED shown in FIGS. 1 and 2 is folded, the pattern glass PG' may be folded. As a second thickness t' of the pattern glass PG' of FIG. 9B decreases, the length WA of the inner side surfaces of the pattern glass PG' may be reduced. As the length WA of the inner side surfaces of the pattern glass PG' decreases, a resistance of the pattern glass PG' against the folding operation may increase in case that the pattern glass PG' is folded. Accordingly, the electronic device ED may not be readily folded.

However, referring to FIGS. 1, 2, and 8B, as the first openings OP1 penetrate the pattern glass PG, a length wt of the inner side surfaces of the pattern portion PGA may be the same as the first thickness t of the pattern glass PG. In case that the first thickness t may be the same as the second thickness t', the length wt of the inner side surfaces shown in FIG. 8B may be longer than the length WA of the inner side surfaces shown in FIG. 9B. Accordingly, in case that the pattern glass PG is folded, the resistance of the pattern glass PG against the folding operation may be reduced. Accordingly, the electronic device ED may be readily folded.

Referring to FIG. 7, multiple filling resins RSG may be provided, and each of the filling resins RSG may be disposed in a corresponding first opening OP1 among the first openings OP1. When viewed in the second direction DR2, the filling resins RSG may be arranged spaced apart from each other in the first direction DR1.

The upper resin layer RSU may be disposed on the upper surface PG-F of the pattern glass PG. The upper resin layer RSU may be disposed between the pattern glass PG and a protective layer PL described later. The upper resin layer RSU may cover the upper surface PG-F of the pattern glass PG and an upper surface of the filling resins RSG.

The lower resin layer RSB may be disposed on the lower surface PG-B of the pattern glass PG. The lower resin layer RSB may be disposed between the pattern glass PG and the anti-reflective layer RPL. The lower resin layer RSB may cover the lower surface PG-B of the pattern glass PG and a lower surface of the filling resins RSB.

The filling resins RSG, the upper resin layer RSU, and the lower resin layer RSB may be integral with each other (e.g., substantially formed integrally with each other). The filling resins RSG, the upper resin layer RSU, and the lower resin layer RSB may include substantially the same material as each other.

As an example, each of the filling resins RSG, the upper resin layer RSU, and the lower resin layer RSB may include a synthetic resin material. Each of the filling resins RSG, the upper resin layer RSU, and the lower resin layer RSB may include a material having the same refractive index as the pattern glass PG. As an example, each of the filling resins RSG, the upper resin layer RSU, and the lower resin layer RSB may include at least one selected from a urethane-based resin, an epoxy-based resin, a polyester-based resin, a polyether-based resin, an acrylate-based resin, an acrylonitrile-butadiene-styrene (ABS) resin, and a rubber. In detail, each of the filling resins RSG, the upper resin layer RSU, and the lower resin layer RSB may include at least one of phenylene, polyethyleneterephthalate (PET), polyimide (PI), polyimide (PA), polyethylene naphthalate (PEN) and polycarbonate (PC).

The protective layer PL may be disposed on the pattern glass PG. The protective layer PL may be disposed on the upper resin layer RSU. The protective layer PL may protect the pattern glass PG from the external impacts. The protective layer PL may include a synthetic resin material. As an example, the protective layer PL may include at least one selected from a urethane-based resin, an epoxy-based resin, a polyester-based resin, a polyether-based resin, an acrylate-based resin, an acrylonitrile-butadiene-styrene (ABS) resin, and a rubber. In detail, the protective layer PL may include at least one of phenylene, polyethyleneterephthalate (PET), polyimide (PI), polyimide (PA), polyethylene naphthalate (PEN) and polycarbonate (PC).

The first window adhesive layer W_AL1 may be disposed on the pattern glass PG. The first window adhesive layer W_AL1 may be disposed on an upper surface of the upper resin layer RSU. The first window adhesive layer W_AL1 may be disposed between the protective layer PL and the upper resin layer RSU, and the protective layer PL may be attached to the upper resin layer RSU by the first window adhesive layer W_AL1.

The first window adhesive layer W_AL1 may include an optically transparent adhesive material. As an example, the first window adhesive layer W_AL1 may include a pressure sensitive adhesive (PSA), an optical clear adhesive (OCA), or an optical clear resin (OCR).

The second window adhesive layer W_AL2 may be disposed under the pattern glass PG. The second window adhesive layer W_AL2 may be disposed on a lower surface of the lower resin layer RSB. The second window adhesive layer W_AL2 may be disposed between the anti-reflective layer RPL and the lower resin layer RSB, and the anti-reflective layer RPL may be attached to the lower resin layer RSB by the second window adhesive layer W_AL2.

Figure 11A:
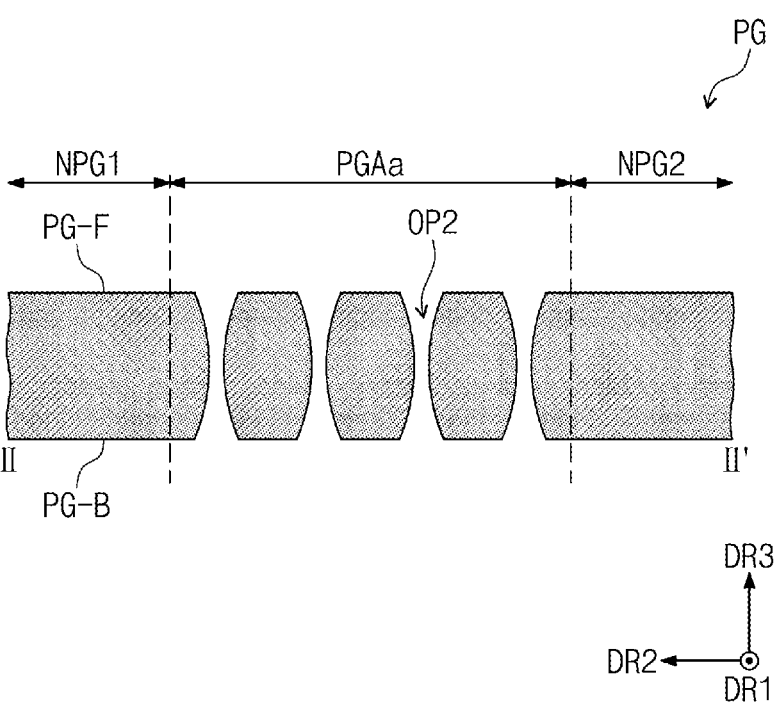
FIGS. 11A to 11C are schematic views illustrating shapes of inner side surfaces of pattern portions according to embodiments of the disclosure.
Figure 11B:
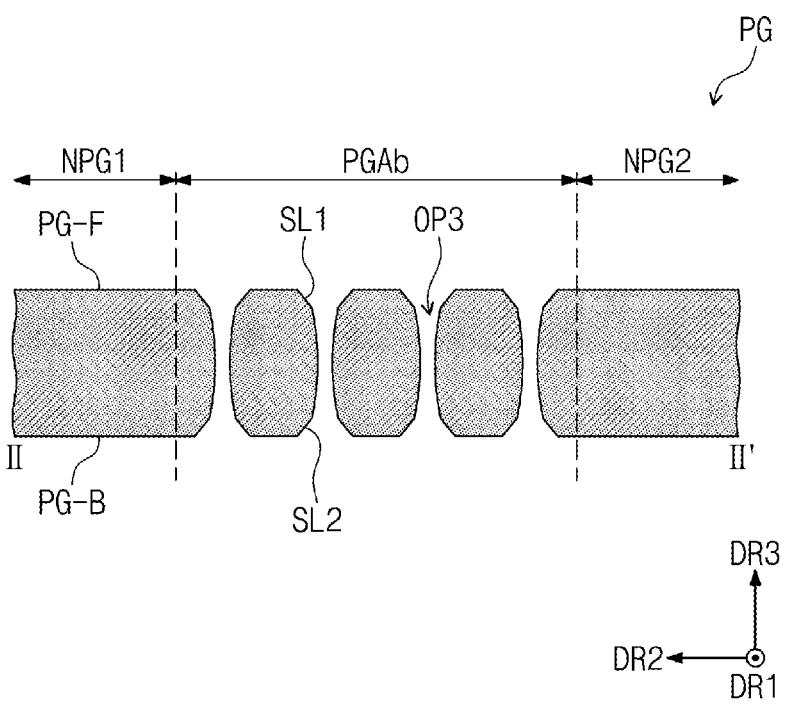
Figure 11C:
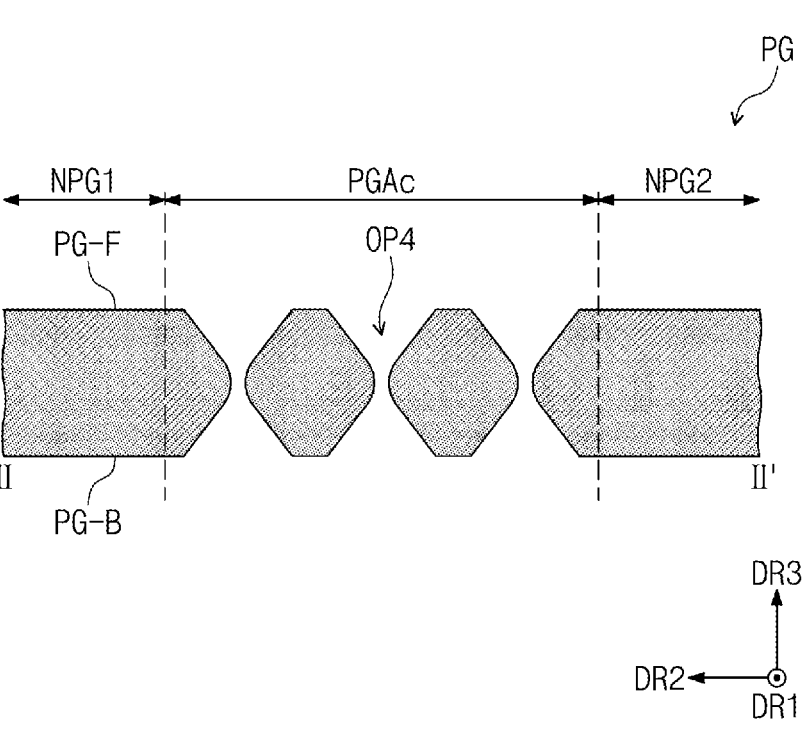

FIGS. 11A to 11C are schematic views illustrating shapes of inner side surfaces of pattern portions according to embodiments of the disclosure.

As an example, FIGS. 11A to 11C are cross-sectional views taken along line II-II' of FIG. 8A.

As an example, descriptions with reference to FIG. 11B will be focused on features different from that of FIG. 11A.

First and second non-pattern portions NPG1 and NPG2 of FIGS. 11A to 11C may be the same as the first and second non-pattern portions NPG1 and NPG2 of FIG. 7, and thus, details thereof will be omitted or briefly described.

Referring to FIG. 11A, second openings OP2 may extend in the third direction DR3 and may penetrate a pattern glass PG.

The inner side surfaces of the pattern portion PGAa, which face each other to define the second openings OP2, may have a curved surface convex toward the second openings OP2. In detail, a width of the second openings OP2 may decrease from an upper surface PG-F of the pattern glass PG to a midpoint, of a thickness of the pattern glass PG. The width of the second openings OP2 may increase from the midpoint of the thickness of the pattern glass PG to a lower surface PG-B of the pattern glass PG.

Each of the second openings OP2 may have a shape symmetrical with respect to a symmetry axis extending in the second direction DR2 at the midpoint of the thickness of the pattern glass PG.

Referring to FIG. 11B, third openings OP3 may extend in the third direction DR3 and may penetrate a pattern glass PG.

The pattern portion PGAb may include first slant surfaces SL1 and second slant surfaces SL2. The first slant surfaces SL1 may connect (extend to/from) the inner side surfaces of the pattern portion PGAb, which face each other to define the third openings OP3, and an upper surface (no reference numeral) of the pattern portion PGAb. The second slant surfaces SL2 may connect the inner side surfaces of the pattern portion PGAb and a lower surface (no reference numeral) of the pattern portion PGAb.

Each of the third openings OP3 may have a shape symmetrical with respect to a symmetry axis extending in the second direction DR2 at a midpoint of the thickness of the pattern glass PG.

Referring to FIG. 11C, each of fourth openings OP4 may have a partial shape of tapered shape. In detail, a width of each of the fourth openings OP4 may increase going from a point of the pattern portion PGAc, which corresponds to a midpoint of a thickness of the pattern portion PGAc, to an upper surface (no reference numeral) or a lower surface (no reference numeral) of the pattern portion PGAc.

Each of the fourth openings OP4 may have a shape symmetrical with respect to a symmetry axis extending in the second direction DR2 at the midpoint of the thickness of the pattern glass PG.

FIGS. 12A to 12F are schematic views illustrating patterns according to embodiments of the disclosure.

As an example, FIGS. 12A to 12F are plan views.

Figure 12A:
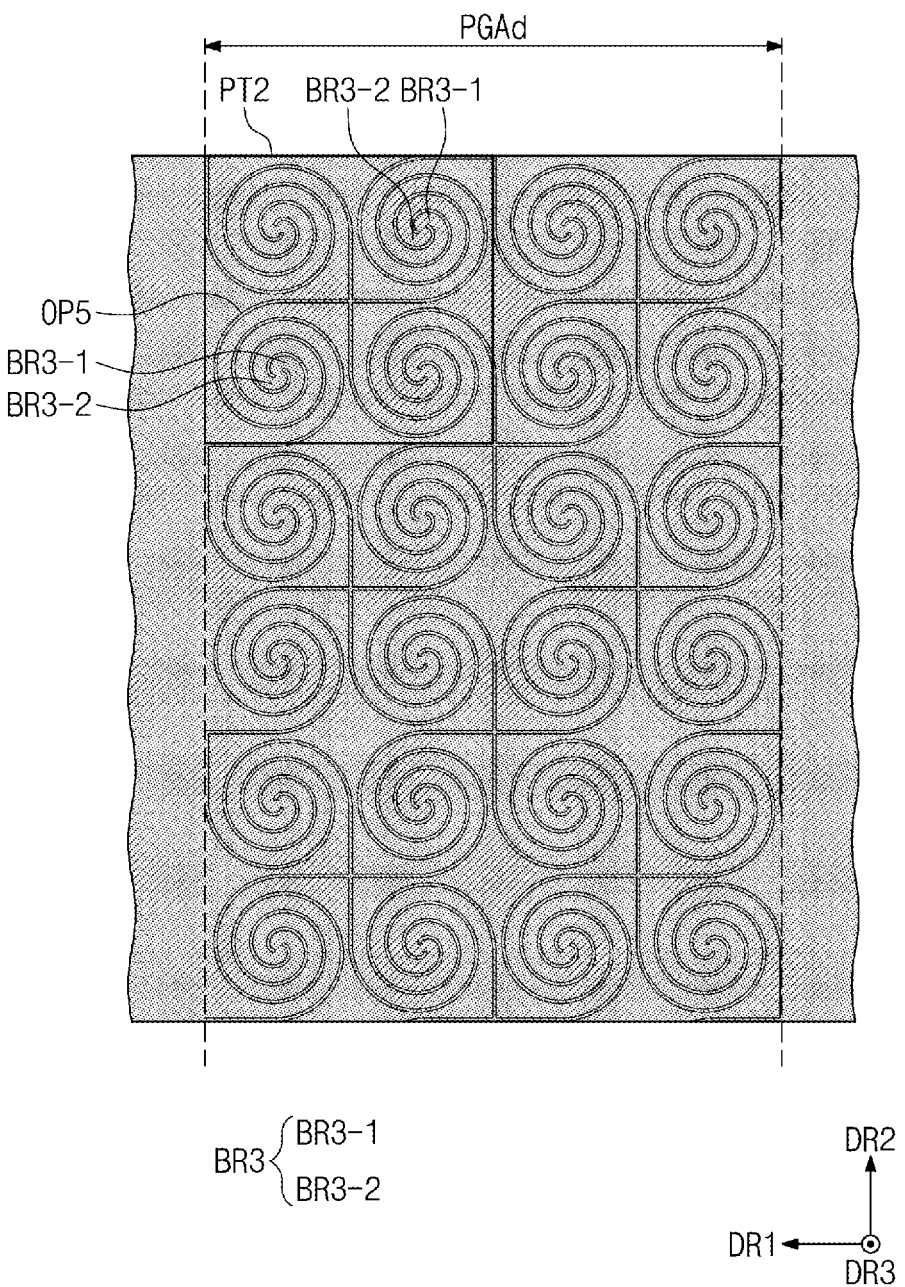
FIGS. 12A to 12F are schematic views illustrating patterns according to embodiments of the disclosure.

Referring to FIG. 12A, a pattern portion PGAd may include second patterns PT2. The second patterns PT2 may be arranged in the first and second directions DR1 and DR2. The second patterns PT2, which have the same shape, may be arranged in a repeated manner The second patterns PT2 may not be separated from each other. The second patterns PT2 may be partially connected to each other.

Each of the second patterns PT2 may include the four spiral shapes that have the same shape and are arranged in the first and second directions DR1 and DR2, and each of the spiral shapes is more rotated by about 90 degrees around a rotation axis parallel to the third direction DR3 along a counter-clockwise direction than another spiral shape disposed adjacent thereto in a clockwise direction. Hereinafter, one spiral shape will be described in detail as a representative example.

The spiral shape may include a third-first branch portion BR3-1 and a third-second branch portion BR3-2. Each of the third-first branch portion BR3-1 and the third-second branch portion BR3-2 may have a curved shape and may have a shape converged to a center of the spiral shape. In a plan view, the third-first branch portion BR3-1 and the third-second branch portion BR3-2 may be connected to each other at the center of the spiral shape.

Fifth openings OP5 may be defined between the third-first branch portion BR3-1 and the third-second branch portion BR3-2 adjacent to the third-first branch portion BR3-1. In a plan view, each of the fifth openings OP5 may be defined to have a shape corresponding the third-first branch portion BR3-1 and the third-second branch portion BR3-2. As an example, the fifth openings OP5 may have the curved shape. In a plan view, one fifth opening OP5 of the fifth openings OP5 may have a shape entwined with another fifth opening OP5 at a center of a corresponding spiral shape among the spiral shapes.

Figure 12B:
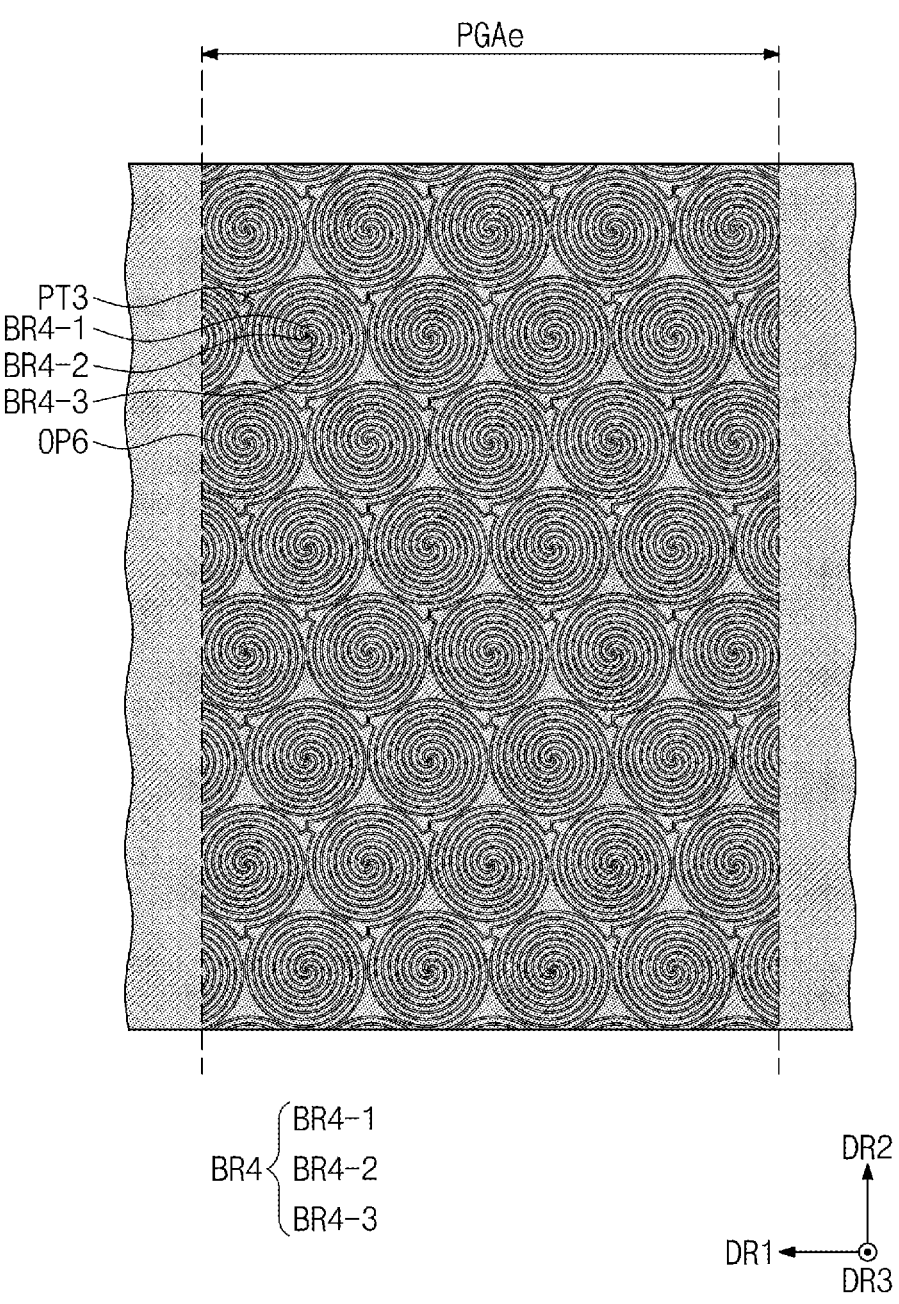

Referring to FIG. 12B, a pattern portion PGAe may include third patterns PT3. The third patterns PT3 may be arranged in the first and second directions DR1 and DR2. The third patterns PT3, which have the same shape, may be arranged in a repeated manner The third patterns PT3 may not be separated from each other. The third patterns PT3 may be partially connected to each other.

In a plan view, among the third patterns PT3, the third patterns PT3 arranged in a k-th row may be arranged staggered with the third patterns PT3 arranged in a (k+1)th row. The k is a natural number equal to or greater than 1. The row may correspond to the first direction DR1. Hereinafter, for the convenience of explanation, one third pattern PT3 of the third patterns PT3 will be described in detail.

In a plan view, the third pattern PT3 may have a spiral shape. The third pattern PT3 may include a fourth-first branch portion BR4-1, a fourth-second branch portion BR4-2, and a fourth-third branch portion BR4-3. In a plan view, each of the fourth-first branch portion BR4-1, the fourth-second branch portion BR4-2, and the fourth-third branch portion BR4-3 may have a curved shape, and the curved shape is converged to a center of the third pattern PT3. In a plan view, the fourth-first branch portion BR4-1, the fourth-second branch portion BR4-2, and the fourth-third branch portion BR4-3 may be connected to each other at the center of the third pattern portion PT3.

Sixth openings OP6 may be defined between the fourth-first branch portion BR4-1, the fourth-second branch portion BR4-2, and the fourth-third branch portion BR4-3, which are adjacent to each other. In a plan view, the sixth opening OP6 may be defined to have a shape corresponding to the fourth-first branch portion BR4-1, the fourth-second branch portion BR4-2, and the fourth-third branch portion BR4-3. As an example, the sixth openings OP6 may have a curved shape. In a plan view, the sixth openings OP6 may have a shape entwined with each other at the center of the third pattern PT3.

Figure 12C:
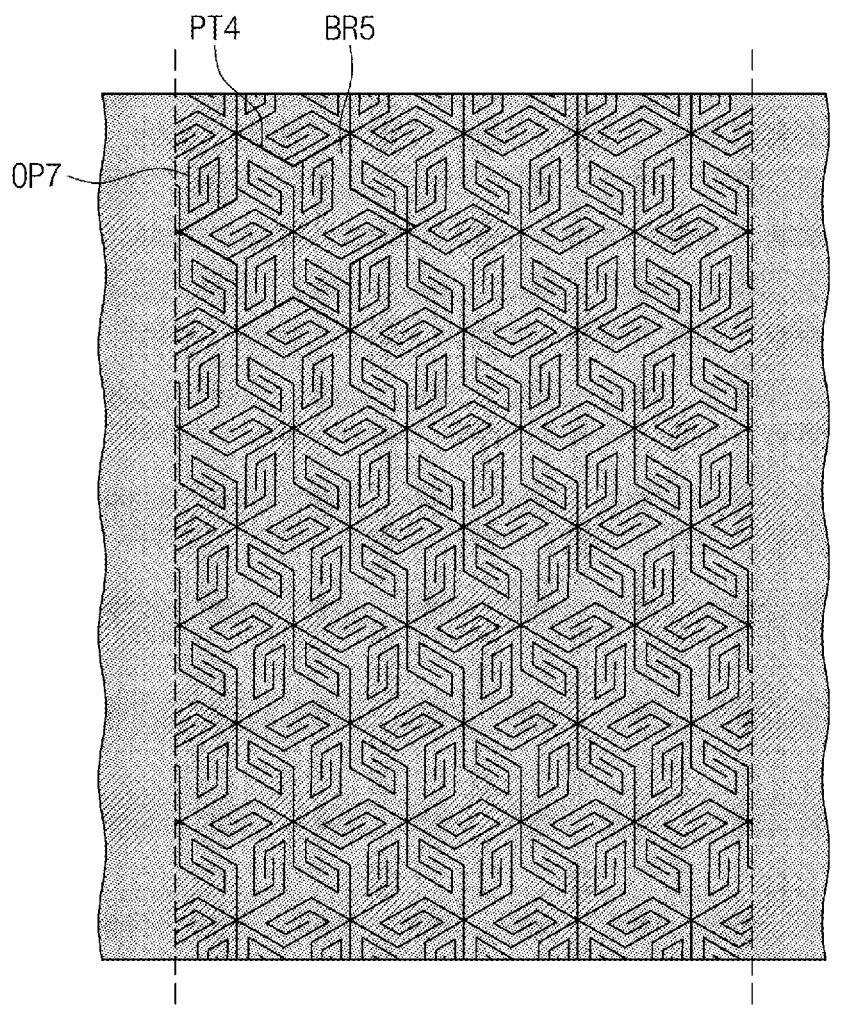
Figure 12C:
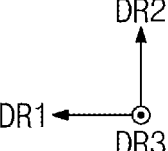

Referring to FIG. 12C, in a plan view, fourth patterns PT4 may be arranged in the first direction DR1 and the second direction DR2. Each of the fourth patterns PT4 may have a snow crystal shape. Each of the fourth patterns PT4 may be partially connected to other fourth patterns PT4 adjacent thereto in the first and second directions DR1 and DR2. Hereinafter, one fourth pattern PT4 will be described in detail as a representative example.

The fourth pattern PT4 may include parallelogram-shaped portions. As an example, the fourth pattern PT4 may include six parallelogram-shaped portions. The parallelogram-shaped portions may be arranged in a shape rotated in a counter-clockwise direction around a rotation axis parallel to the third direction DR3.

Each of the parallelogram-shaped portions may include a fifth branch portion BR5. The fifth branch portion BR5 may be connected to the parallelogram-shaped portions adjacent to each other in the same fourth pattern PT4 and the parallelogram-shaped portions forming another fourth pattern PT4.

Seventh openings OP7 may be defined between the fifth branch portions BR5 adjacent to each other. The seventh openings OP7 may be connected to each other at a center of the fourth pattern PT4. The seventh openings OP7 may have a shape entwined with the seventh openings OP7 extending from fourth patterns PT4 in an area adjacent to an edge of the fourth pattern PT4.

Figure 12D:
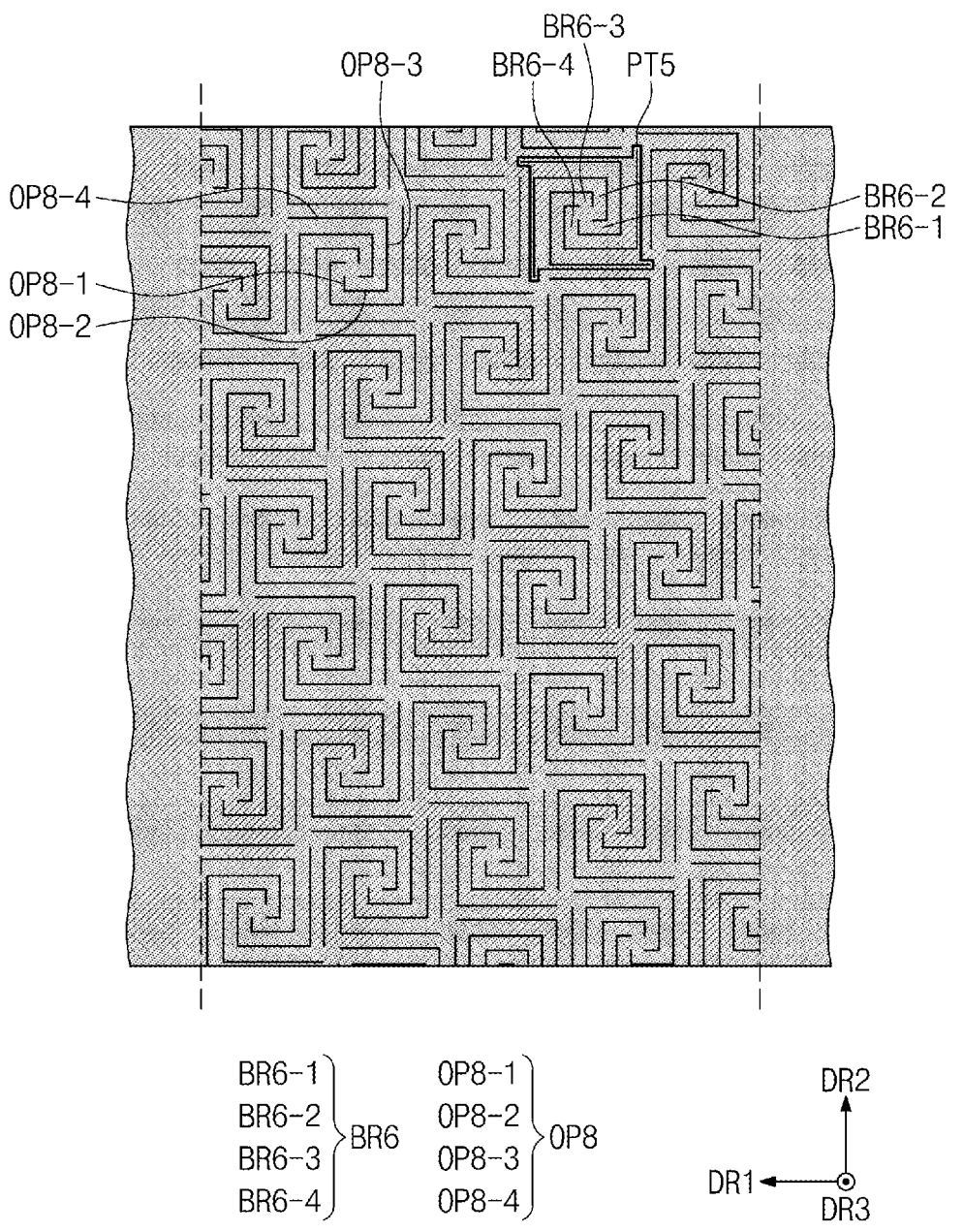

Referring to FIG. 12D, in a plan view, fifth patterns PT5 may be arranged in the first and the second directions DR1 and DR2. An edge of each of the fifth patterns PT5 may have a pinwheel (e.g., pinwheel-like) shape. The fifth patterns PT5 may be partially connected to other fifth patterns PT5 adjacent thereto in the first and second directions DR1 and DR2. Hereinafter, one fifth pattern PT5 will be described in detail as a representative example.

The fifth pattern PT5 may include a sixth-first branch portion BR6-1, a sixth-second branch portion BR6-2, a sixth-third branch portion BR6-3, and a sixth-fourth branch portion BR6-4. In a plan view, each of the sixth-first branch portion BR6-1 to the sixth-fourth branch portion BR6-4 may alternately extend in the direction parallel to the first direction DR1 and the direction parallel to the second direction DR2. In a plan view, the sixth-first branch portion BR6-1 to the sixth-fourth branch portion BR6-4 may have a shape converged to a center of the fifth pattern PT5. In a plan view, the sixth-first branch portion BR6-1 to the sixth-fourth branch portion BR6-4 may be connected to each other at the center of the fifth pattern PT5.

In a plan view, the sixth-first to sixth-fourth branch portions BR6-1 to BR6-4 may be arranged in a shape rotated around a rotational axis parallel to the third direction DR3.

Eighth openings OP8 may be defined between the sixth-first, sixth-second, sixth-third, and sixth-fourth branch portions BR6-1, BR6-2, BR6-3, and BR6-4, which are adjacent to each other. In a plan view, the eighth openings OP8 may be defined to have a shape corresponding to the sixth-first branch portion BR6-1 to the sixth-fourth branch portion BR6-4.

Each of the eighth openings OP8 may alternately extend in the directions respectively parallel to the first and second directions DR1 and DR2. Hereinafter, for the convenience of explanation, one eighth opening OP8 will be described in detail. Other eighth openings OP8 defined in the fifth pattern PT5 may be substantially the same as the one eighth opening OP8 except an extension direction thereof. Each of the eighth openings OP8 may involve an eighth-first opening OP8-1, an eighth-second opening OP8-2, an eighth-third opening OP8-3, and an eighth-fourth opening OP8-4.

As an example, a side of sides opposite to each other in the second direction DR2 of an eighth-first opening OP8-1 may be defined adjacent to a center of the fifth pattern PT5. Another side of the sides of the eighth-first opening OP8-1 may extend in the second direction DR2.

An eighth-second opening OP8-2 may extend from another side of the eighth-first opening OP8-1 to the first direction DR1.

An eighth-third opening OP8-3 may extend from a side of the eighth-second opening OP8-2 to the second direction DR2. The side of the eighth-second opening OP8-2 may be defined as a side opposite to another side connected to the eighth-first opening OP8-1.

An eighth-fourth opening OP8-4 may extend from a side of the eighth-third opening OP8-3 to the first direction DR1. The side of the eighth-third opening OP8-3 may be defined as a side opposite to another side connected to the side of the eighth-second opening OP8-2.

Figure 12E:
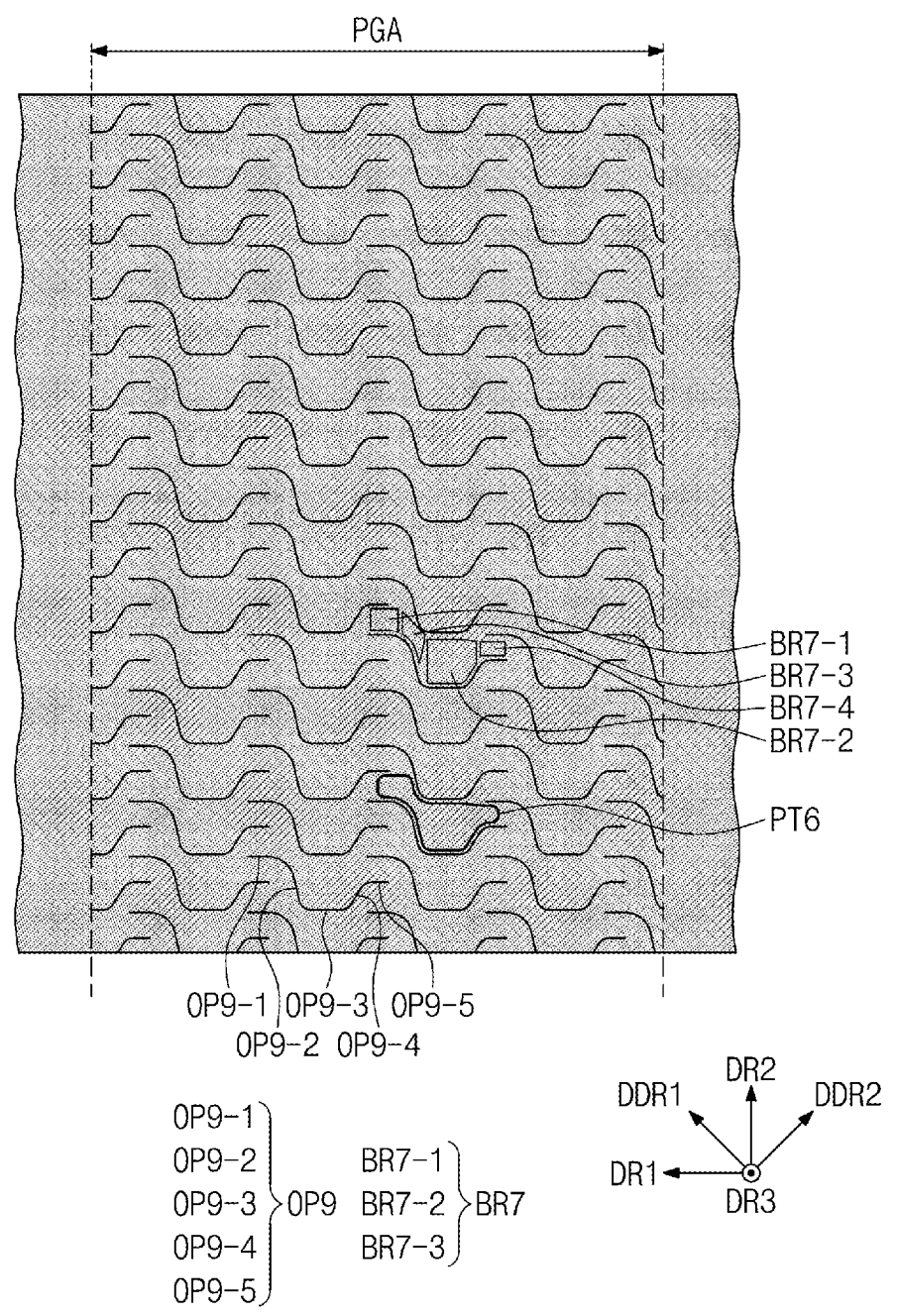

Referring to FIG. 12E, a pattern portion PGA may include sixth patterns PT6. The sixth patterns PT6 may be arranged in the first and second directions DR1 and DR2. The sixth patterns PT6 may have the same shape as each other and may be arranged in a repeated manner The sixth patterns PT6 may not be separated from each other. The sixth patterns PT6 may be partially connected to each other.

In a plan view, among the sixth patterns PT6, the sixth patterns PT6 arranged in an h-th column may be arranged staggered with the sixth patterns PT6 arranged in an (h+1)th column. The h is a natural number equal to or greater than 1. The column may correspond to the second direction DR2. Hereinafter, for the convenience of explanation, one sixth pattern PT6 among the sixth patterns PT6 will be described in detail.

In a plan view, the sixth pattern PT6 may have a scale (e.g., scale-like) shape. The sixth pattern PT6 may include seventh-first, seventh-second, seventh-third, and seventh-fourth branch portions BR7-1, BR7-2, BR7-3, and BR7-4. In a plan view, the seventh-first branch portion BR7-1, the seventh-second branch portion BR7-2, and the seventh-third branch portion BR7-3 may be arranged in a direction parallel to a first diagonal direction DDR1. The seventh-third branch portion BR7-3 may be disposed between the seventh-first branch portion BR7-1 and the seventh-second branch portion BR7-2. The first diagonal direction DDR1 may be defined as a direction intersecting the first and second directions DR1 and DR2.

In a plan view, the seventh-second branch portion BR7-2 and the seventh-fourth branch portion BR7-4 may be arranged in the first direction DR1.

In a plan view, the seventh-first branch portion BR7-1, the seventh-second branch portion BR7-2, and the seventh-third branch portion BR7-3 may be connected to each other. As an example, the seventh-first branch portion BR7-1 may be connected to a side of the seventh-third branch portion BR7-3, and the seventh-second branch portion BR7-2 may be connected to another side of the seventh-third branch portion BR7-3. The seventh-first branch portion BR7-1 may be connected to the seventh-second branch portion BR7-2 by the seventh-third branch portion BR7-3.

In a plan view, the seventh-second branch portion BR7-2 and the seventh-fourth branch portion BR7-4 may be connected to each other.

In a plan view, the seventh-first branch portion BR7-1 may have a quadrangular shape. In a plan view, the seventh-second branch portion BR7-2 may have a pentagon shape. In a plan view, the seventh-fourth branch portion BR7-4 may have a quadrangular shape.

In a plan view, the seventh-second branch portion BR7-2 may have a size greater than a size of the seventh-first branch portion BR7-1. The seventh-first branch portion BR7-1 may have a size greater than a size of the seventh-fourth branch portion BR7-4. The size of the seventh-third branch portion BR7-3 may be greater than a size of the seventh-fourth branch portion BR7-4.

In a plan view, a ninth opening OP9 may be defined under the seventh-first branch portion BR7-1 to the seventh-fourth branch portion BR7-4. In a plan view, the ninth opening OP9 may be defined to have a shape corresponding to the seventh branch portion BR7.

As an example, in a plan view, a ninth-first opening OP9-1 may be defined under the seventh-first branch portion BR7-1 and may extend in the first direction DR1 along the seventh-first branch portion BR7-1. A side of sides opposite to each other in the first direction DR1 of the ninth-first opening OP9-1 may be connected to a ninth-second opening OP9-2. The side of the ninth-first opening OP9-1 may have a curved shape. The side of the ninth-first opening OP9-1 may be defined adjacent to the seventh-third branch portion BR7-3.

The ninth-second opening OP9-2 may extend in the first diagonal direction DDR1. A side of sides opposite to each other in the first diagonal direction DDR1 of the ninth-second opening OP9-2 may have a curved shape. The side of the ninth-second opening OP9-2 may be connected to a ninth-third opening OP9-3. The side of the ninth-second opening OP9-2 may be defined as a side opposite to another side connected to the ninth-first opening OP9-1.

The ninth-third opening OP9-3 may extend in the first direction DR1. A side of sides opposite to each other in the first direction DR1 of the ninth-third opening OP9-3 may have a curved shape. The side of the ninth-third opening OP9-3 may be connected to a ninth-fourth opening OP9-4.

The side of the ninth-third opening OP9-3 may be defined as a side opposite to another side connected to the ninth-second opening OP9-2.

The ninth-fourth opening OP9-4 may extend in the second diagonal direction DDR2. The second diagonal direction DDR2 may intersect the first diagonal direction DDR1. A side of sides opposite to each other in the second diagonal direction DDR2 of the ninth-fourth opening OP9-4 may have a curved shape. The side of the ninth-fourth opening OP9-4 may be connected to a ninth-fifth opening OP9-5. The side of the ninth-fourth opening OP9-4 may be defined as a side opposite to another side connected to the ninth-third opening OP9-3.

The ninth-fifth opening OP9-5 may extend in the first direction DR1.

Figure 12F:
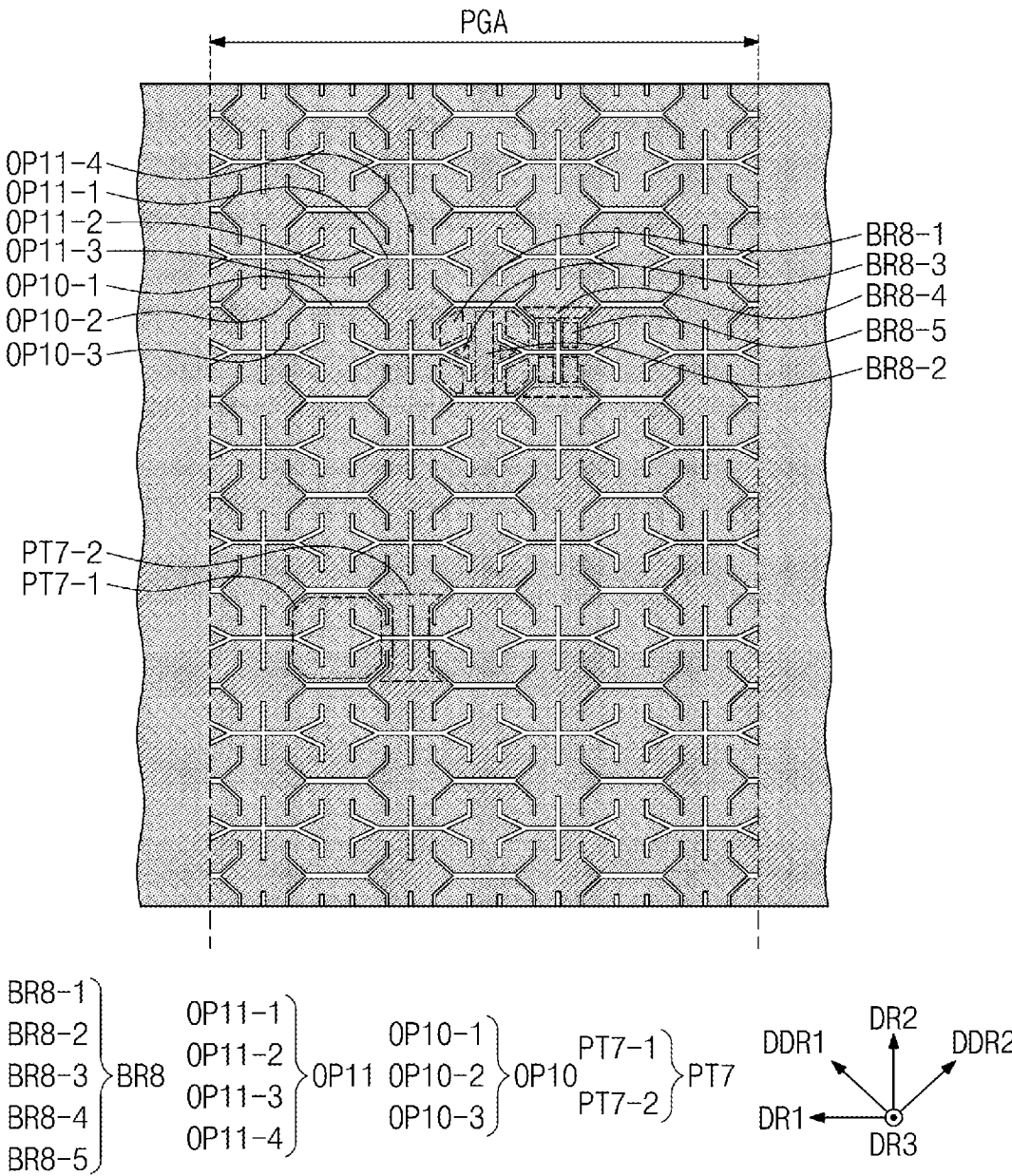

Referring to FIG. 12F, a pattern portion PGA may include seventh patterns PT7. The seventh patterns PT7 may be arranged in the first direction DR1 and the second direction DR2. The seventh patterns PT7 may have the same shape as each other and may be arranged in a repeated manner The seventh patterns PT7 may not be separated from each other. The seventh patterns PT7 may be partially connected to each other.

As an example, in a plan view, an edge of each of the seventh patterns PT7 may have octagonal shapes PT7-1 and column shapes PT7-2. However, the disclosure should not be limited thereto or thereby, and the octagonal shapes PT7-1 or the column shapes PT7-2 may be omitted.

The octagonal shapes PT7-1 may be alternately arranged with the column shapes PT7-2 in the first direction DR1. The octagonal shapes PT7-1 may be arranged in the second direction DR2. The column shapes PT7-2 may be arranged in the second direction DR2. The octagonal shapes PT7-1 may be partially connected to the column shapes PT7-2 adjacent to the octagonal shapes PT7-1 in the first direction DR1. Hereinafter, one octagonal shape PT7-1 and one column shape PT7-2 will be described in detail.

In a plan view, the octagonal shape PT7-1 may include eighth-first branch portions BR8-1, an eighth-second branch portion BR8-2, and eighth-third branch portions BR8-3. The eighth-first branch portions BR8-1 may be arranged adjacent to the edge of the octagonal shape PT7-1. A pair of the eighth-first branch portions BR8-1 and another pair of the eighth-first branch portions BR8-1 may be arranged opposite to each other in the first direction DR1. An eighth-first branch portion BR8-1 and another eighth-first branch portion BR8-1 forming one pair of the eighth-first branch portions BR8-1 may be arranged opposite to each other in the second direction DR2. In a plan view, each of the eighth-first branch portions BR8-1 may have a polygonal shape with five sides.

The eighth-second branch portion BR8-2 may be disposed between the two pairs of the eighth-first branch portions BR8-1. The eighth-second branch portion BR8-2 may extend in the second direction DR2. In a plan view, the eighth-second branch portion BR8-2 may have a rectangular shape.

Eighth-third branch portions BR8-3 may be disposed adjacent to sides opposite to each other in the first direction DR1 of the eighth-second branch portion BR8-2. The eighth-third branch portions BR8-3 may be arranged symmetrically with each other in the first direction DR1. In a plan view, each of the eighth-third branch portions BR8-3 may have a triangular shape.

In a plan view, the column shape PT7-2 may include eighth-fourth branch portions BR8-4 and eighth-fifth branch portions BR8-5. The eighth-fourth branch portions BR8-4 may be arranged adjacent edges of sides opposite to each other in the second direction DR2 of the column shapes PT7-2. The eighth-fourth branch portions BR8-4 may be symmetrical with each other with respect to the second direction DR2. In a plan view, each of the eighth-fourth branch portions BR8-4 may have a trapezoidal shape.

In a plan view, the eighth-fifth branch portions BR8-5 may be disposed between the eighth-fourth branch portions BR8-4. The eighth-fifth branch portions BR8-5 may be arranged in the first and second directions DR1 and DR2. In a plan view, each of the eighth-fifth branch portions BR8-5 may have a rectangular shape.

Tenth openings OP10 and eleventh openings OP11 may be defined adjacent to the seventh pattern PT7. The tenth openings OP10 may be defined between the octagonal shapes PT7-1 adjacent to each other in the second direction DR2. The tenth openings OP10 may be defined adjacent to the edge of the octagonal shapes PT7-1.

The tenth openings OP10 may be defined to have a shape corresponding to the edge of the octagonal shapes PT7-1. As an example, tenth-first openings OP10-1 may extend in the first direction DR1.

Tenth-second openings OP10-2 may extend from sides opposite to each other in the first direction DR1 of the tenth-first openings OP10-1 to the first diagonal direction DDR1 and the second diagonal direction DDR2. Hereinafter, the first diagonal direction DDR1 may be defined to intersect the first and second directions DR1 and DR2. The second diagonal direction DDR2 may be defined to intersect the first diagonal direction DDR1.

Tenth-third openings OP10-3 may extend from a side of sides of the tenth-second openings OP10-2, which are opposite to each other in the first and second diagonal directions DDR1 and DDR2. Each of the tenth-third openings OP10-3 may extend in the second direction DR2. The side of the tenth-second openings OP10-2 may be defined as a side opposite to another side connected to the tenth-first openings OP10-1.

The eleventh openings OP11 may extend from a center of a length in the first direction DR1 of the eighth-second branch portions BR8-2 and a center of a length in the second direction DR2 of the eighth-second branch portions BR8-2. As an example, eleventh-first openings OP11-1 may extend in the first direction DR1. The eleventh-first openings OP11-1 may extend to the eighth-first branch portions BR8-1 adjacent to the eighth-second branch portions BR8-2 in the first direction DR1.

Eleventh-second openings OP11-2 may extend from sides opposite to each other in the first direction DR1 of the eleventh-first openings OP11-1. The eleventh-second openings OP11-2 may extend in the first diagonal direction DDR1 or the second diagonal direction DDR2.

Each of eleventh-third openings OP11-3 may extend from a side of a corresponding eleventh-second opening OP11-2 among the eleventh-second openings OP11-2 to the second direction DR2. The side of the eleventh-second openings OP11-2 may be defined as a side opposite to another side connected to the eleventh-first openings OP11-1.

Each of the eleventh-fourth openings OP11-4 may extend in the second direction DR2.

Referring to FIGS. 12A to 12F, as the fifth to eleventh openings OP5 to OP11 extend in two or more directions among the first direction DR1, the second direction DR2, the first diagonal direction DD1, and the second diagonal direction DDR2 or have the curved shape, the second to eighth branch portions BR3 to BR8 may be bent in multiple directions in case that the external impact is applied to the pattern portion PGA, and thus, the impact force may be dispersed. Accordingly, the impact resistance of the pattern glass PG may be improved.

Figure 13A:
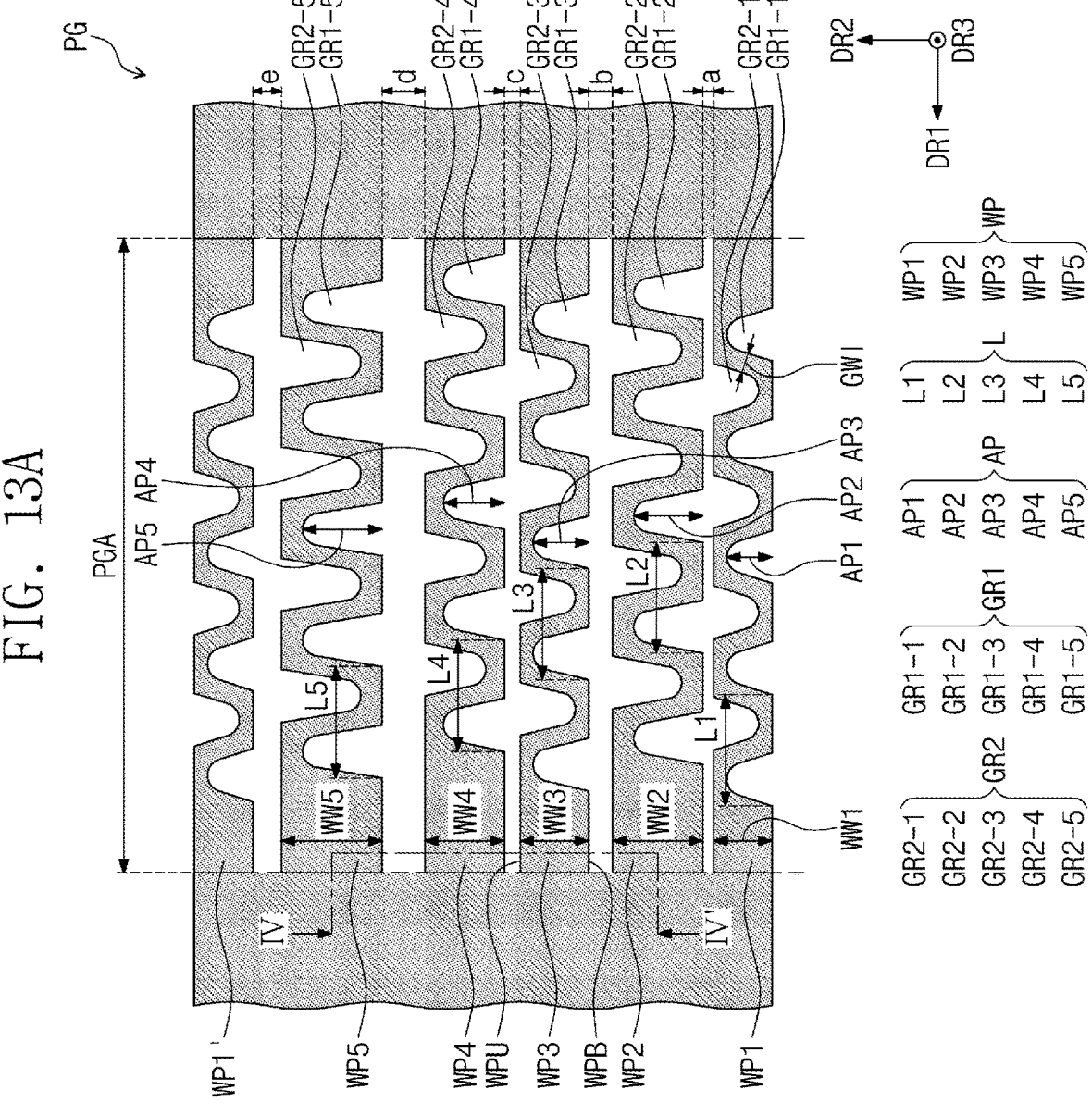
FIGS. 13A and 13B are schematic views of a pattern glass according to an embodiment of the disclosure.
Figure 13B:
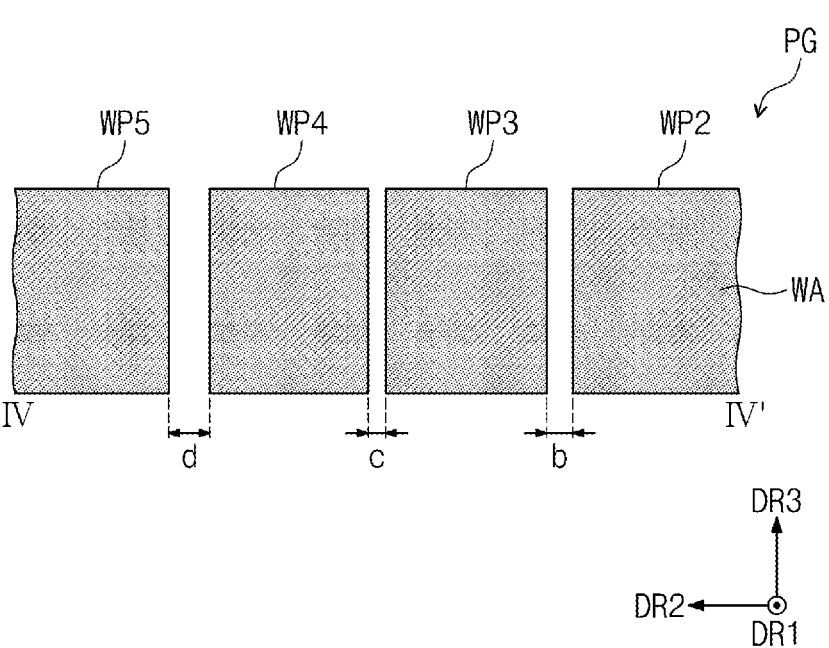

FIGS. 13A and 13B are schematic views of a pattern glass according to an embodiment of the disclosure.

FIG. 13A is a plan view of the pattern glass, and FIG. 13B is a cross-sectional view taken along line IV-IV' of FIG. 13A.

Referring to FIG. 13A, a pattern portion PGA may include wave patterns WP. Each of the wave patterns WP may include first, second, third, fourth, and fifth wave patterns WP1, WP2, WP3, WP4, and WP5, and the wave patterns WP may be repeatedly arranged in the second direction DR2. As an example, FIG. 13A shows the wave pattern WP of a first group and a first wave pattern WP1' of the wave pattern WP of a second group.

The first to fifth wave patterns WP1 to WP5 may be arranged in rows. In a plan view, the first wave pattern WP1 to the fifth wave pattern WP5 may be sequentially arranged in the second direction DR2. The rows may correspond to the first direction DR1.

The first to fifth wave patterns WP1 to WP5 may be arranged spaced apart from each other in the second direction DR2. A distance between the first to fifth wave patterns WP1 to WP5 spaced apart from each other in the second direction DR2 may be within a range of about 10 to about 200 micrometers. A space between the wave patterns spaced apart from each other in the second direction DR2 may be defined as an opening (no reference numeral).

The distance between the first to fifth wave patterns WP1 to WP5 spaced apart from each other in the second direction DR2 may not be constant. As an example, a first distance a between the first wave pattern WP1 and the second wave pattern WP2 may be smaller than a third distance c between the third wave pattern WP3 and the fourth wave pattern WP4.

As an example, the third distance c may be smaller than a second distance b between the second wave pattern WP2 and the third wave pattern WP3.

As an example, the second distance b may be smaller than a fifth distance e between the fifth wave pattern WP5 and the first wave pattern WP1' of the second group wave pattern WP.

As an example, the fifth distance e may be smaller than a fourth distance d between the fourth wave pattern WP4 and the fifth wave pattern WP5. As an example, among the first to fifth distances a to e, the first distance a may be the smallest distance, and the fifth distance e may be the largest distance. However, the disclosure should not be limited thereto or thereby, and the order of size of the first to fifth distances a to e may be changed.

Each of the first to fifth wave patterns WP1 to WP5 may have a length from about 0.625 mm to about 1.125 mm in the second direction DR2. The lengths in the second direction DR2 of the first to fifth wave patterns WP1 to WP5 may be different from each other.

As an example, a first width WW1 in the second direction DR2 of the first wave pattern WP1 may be smaller than a third width WW3 of the third wave pattern WP3.

As an example, the third width WW3 of the third wave pattern WP3 may be smaller than a fourth width WW4 of the fourth wave pattern WP4.

As an example, the fourth width WW4 of the fourth wave pattern WP4 may be smaller than a second width WW2 of the second wave pattern WP2.

As an example, the second width WW2 of the second wave pattern WP2 may be smaller than a fifth width WW5 of the fifth wave pattern WP5. As an example, among the first to fifth widths WW1 to WW5, the first width WW1 may be the smallest width, and the fifth width WW5 may be the largest width. However, the disclosure should not be limited thereto or thereby, and the order of size of the first to fifth widths WW1 to WW5 may be changed. Hereinafter, the first to fifth widths WW1 to WW5 may be defined as the lengths of the first to fifth wave patterns WP1 to WP5 in the second direction DR2.

In a plan view, first grooves GR1 and second grooves GR2 may be defined in each of the first to fifth wave patterns WP1 to WP5. In a plan view, the first grooves GR1 may be defined in a lower surface WPB of the wave patterns WP. The second grooves GR2 may be defined in an upper surface WPU of the wave patterns WP. Hereinafter, the upper surface WPU of each of the wave patterns WP1 to WP5 may be defined as a surface of an n-th wave pattern WP, which faces (n+1)th wave pattern WP. The lower surface WPB of each of the wave patterns WP1 to WP5 may be defined as a surface of the (n+1)th wave pattern WP, which faces the upper surface WPU of the n-th wave pattern WP. The n is a natural number equal to or greater than 1. The n may sequentially increase along the second direction DR2.

The lower surface of the first wave pattern WP1 may be opposite to the upper surface of the first wave pattern WP1, which faces the second wave pattern WP2.

In a plan view, the first grooves GR1 may extend in the second direction DR2 and may be arranged in the first direction DR1. The first grooves GR1 may extend from the lower surface WPB of the wave patterns WP to the upper surface WPU.

In a plan view, the first grooves GR1 may have a concave shape in the second direction DR2. In a plan view, a bottom surface of the first grooves GR1 may have a curved surface.

In a plan view, the second grooves GR2 may extend in the second direction DR2 and may be arranged in the first direction DR1. The second grooves GR2 may extend from the upper surface WPU of the wave patterns WP to the lower surface WPB.

Second-first grooves GR2-1 may extend from upper surface WPU to the lower surface WPB of the first wave pattern WP1. The second-second grooves GR2-2 may extend from the upper surface WPU of the second wave pattern WP2 to the lower surface WPB of the second wave pattern WP2. A bottom surface of the second grooves GR2 may have a curved surface.

In a plan view, the first grooves GR1 and the second grooves GR2 may extend more than ½ of the width of the wave patterns WP in the second direction DR2. The first grooves GR1 may extend in a direction opposite to a direction in which the second grooves GR2 extend. In a plan view, the first grooves GR1 may be substantially the same as the second grooves GR2 except the extension direction. Hereinafter, the longest length of each of the first grooves GR1 and second grooves GR2 in the second direction DR2 may be defined as an amplitude AP.

The first and second grooves GR1 and GR2 defined in each of the first to fifth wave patterns WP1 to WP5 may have different sizes in amplitude AP from each other. The size of the amplitude AP may be proportional to the first to fifth widths WW1 to WW5 of the first to fifth wave patterns WP1 to WP5.

As an example, a first amplitude AP1 of the first wave pattern WP1 may be smaller than a third amplitude AP3 of the third wave pattern WP3.

As an example, the third amplitude AP3 of the third wave pattern WP3 may be smaller than a fourth amplitude AP4 of the fourth wave pattern WP4.

As an example, the fourth amplitude AP4 of the fourth wave pattern WP4 may be smaller than a second amplitude AP2 of the second wave pattern WP2.

As an example, the second amplitude AP2 of the second wave pattern WP2 may be smaller than a fifth amplitude AP5 of the fifth wave pattern WP5. As an example, among the first to fifth amplitudes AP1 to AP5, the first amplitude AP1 may have the smallest size, and the fifth amplitude AP5 may have the largest size, however, the disclosure should not be limited thereto or thereby. In case that the order of size of the first to fifth widths WW1 to WW5 is changed, the order of size of the amplitudes AP may be changed.

In a plan view, the first grooves GR1 may be arranged staggered with the second grooves GR2. A distance GW1 between the first grooves GR1 and the second grooves GR2 adjacent to the first grooves GR1 in the first direction DR1 may be within a range of about 90 micrometers to about 250 micrometers.

Hereinafter, a length in the first direction DR1 of the wave pattern WP in which one first groove GR1 and one second groove GR2 are defined may be defined as one wavelength L. Each of the first to fifth wave patterns WP1 to WP5 may have a uniform wavelength L.

First, second, third, fourth, and fifth wavelength lengths L1, L2, L3, L4, and L5 of the first to fifth wave patterns WP1 to WP5 may be different from each other. As an example, the first wavelength L1 of the first wave pattern WP1 may be smaller than the third wavelength L3 of the third wave pattern WP3.

As an example, the third wavelength L3 of the third wave pattern WP3 may be smaller than the fourth wavelength L4 of the fourth wave pattern WP4.

As an example, the fourth wavelength L4 of the fourth wave pattern WP4 may be smaller than the second wavelength L2 of the second wave pattern WP2.

As an example, the second wavelength L2 of the second wave pattern WP2 may be smaller than the fifth wavelength L5 of the fifth wave pattern WP5. As an example, among the first to fifth wavelengths L1 to L5, the first wavelength L1 may be the smallest length, and the fifth wavelength L5 may be the largest length. However, the disclosure should not be limited thereto or thereby, and the order of size of the first, second, third, fourth, and fifth wavelength lengths L1, L2, L3, L4, and L5 may be changed.

In case that the patterns having the same shape are repeatedly arranged, a moiré phenomenon may occur. In case that the moiré phenomenon occurs, the images IM generated by the display surface DS of FIG. 1 may be distorted while being provided to the user.

However, according to the pattern glass PG of the disclosure, since each of the wavelengths L, the sizes of the amplitude AP, the widths WW1 to WW5 of the wave patterns WP, and the first to fifth distances a to e are different from each other, the patterns having the same shape may not be repeatedly arranged. Accordingly, the images IM may be provided to the user without being distorted.

Referring to FIGS. 13A and 13B, when viewed in the first direction DR1, inner side surfaces of the wave patterns WP, which face each other, may have a straight line shape extending in the third direction DR3. However, the inner side surfaces of the wave patterns WP should not be limited thereto or thereby and may have a variety of shapes. The shape of the inner side surfaces of the wave patterns WP will be described in detail with reference to FIGS. 14A and 14B.

As described with reference to FIG. 13A, the third distance c may be smaller than the second distance b. As an example, the second distance b may be smaller than the fourth distance d.

Figure 14A:
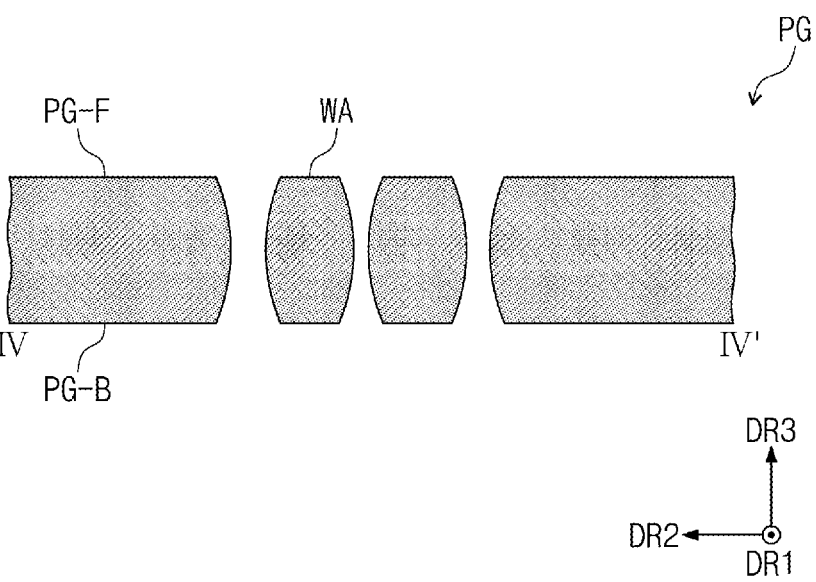
FIGS. 14A and 14B are schematic views illustrating inner side surfaces of wave patterns according to embodiments of the disclosure.
Figure 14B:
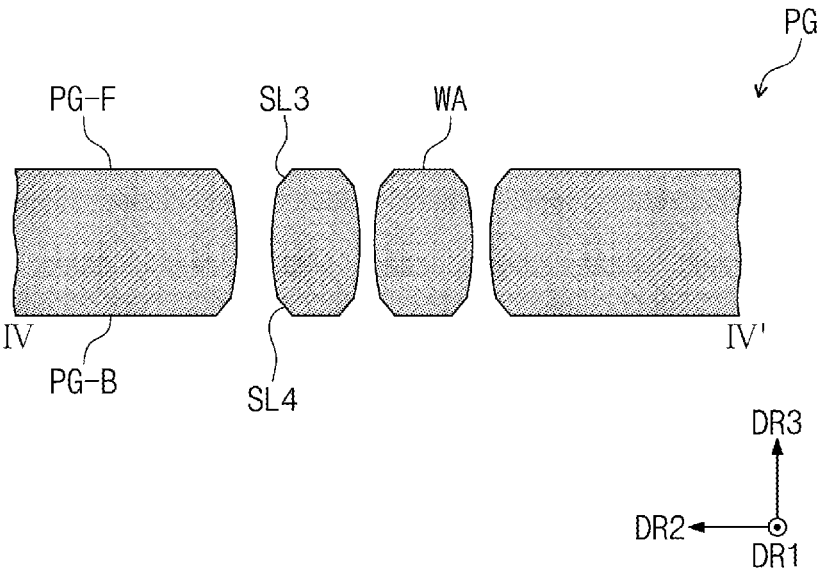

FIGS. 14A and 14B are schematic views illustrating inner side surfaces of wave patterns according to embodiments of the disclosure.

FIGS. 14A to 14B are cross-sectional views taken along line IV-IV' of FIG. 13A.

For the convenience of explanation, any further repetitive descriptions of the same elements as those described with reference to FIGS. 13A and 13B will be omitted.

Referring to FIG. 14A, the inner side surfaces of the wave patterns WA, which face each other, may have a convex curved surface. In detail, a distance between the wave patterns WA may decrease going from an upper surface PG-F of a pattern glass PG to a midpoint of a thickness of the pattern glass PG. The distance between the wave patterns WA may increase going from the midpoint of the thickness of the pattern glass PG to a lower surface PG-B of the pattern glass PG.

The inner side surfaces of the wave patterns WA, which face each other, may have a symmetrical shape with respect to a symmetry axis extending in the second direction DR2 and passing through the midpoint of the thickness of the pattern glass PG.

Referring to FIG. 14B, the inner side surfaces of the wave patterns WA, which face each other, may include third slant surfaces SL3 and fourth slant surfaces SL4. The third slant surfaces SL3 may connect upper surfaces (no reference numeral) of the wave patterns WA and the inner side surfaces of the wave patterns WA. The fourth slant surfaces SL4 may connect lower surfaces (no reference numeral) of the wave patterns WA and the inner side surfaces of the wave patterns WA.

Referring to FIGS. 13B, 14A, and 14B, as the wave patterns WA adjacent to each other in the second direction DR2 may be spaced apart from each other and separated from each other, a length of the inner side surfaces of the wave patterns WA may increase. Accordingly, in case that the pattern glass PG is folded, the resistance of the pattern glass PG against the folding operation may be reduced. Accordingly, the electronic device ED of FIG. 1 may be readily folded.

Figure 15:
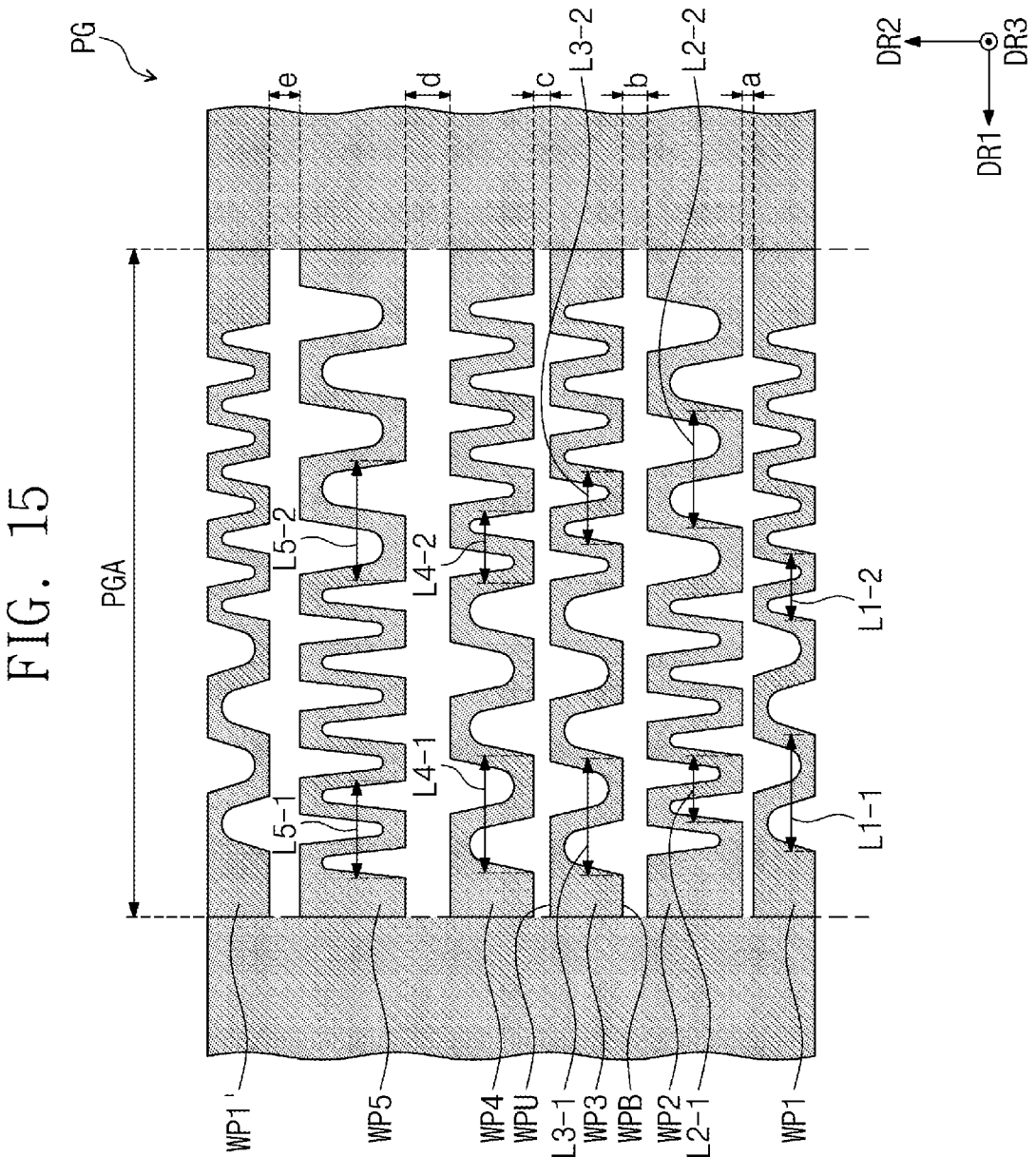
FIG. 15 is a schematic plan view of wave patterns according to an embodiment of the disclosure.

FIG. 15 is a schematic plan view of wave patterns according to an embodiment of the disclosure.

In FIG. 15, any further repetitive descriptions of the same elements as those described with reference to FIG. 13A will be omitted or briefly described.

Referring to FIG. 15, each of first, second, third, fourth, and fifth wave patterns WP1, WP2, WP3, WP4, and WP5 may have a wavelength that varies at least once.

As an example, the first wave pattern WP1 may have a first-first wavelength L1-1 and a first-second wavelength L1-2. The first-first wavelength L1-1 may be greater than the first-second wavelength L1-2.

As an example, the second wave pattern WP2 may have a second-first wavelength L2-1 and a second-second wavelength L2-2. The second-first wavelength L2-1 may be smaller than the second-second wavelength L2-2.

As an example, the third wave pattern WP3 may have a third-first wavelength L3-1 and a third-second wavelength L3-2. The third-first wavelength L3-1 may be greater than the third-second wavelength L3-2.

As an example, the fourth wave pattern WP4 may have a fourth-first wavelength L4-1 and a fourth-second wavelength L4-2. The fourth-first wavelength L4-1 may be greater than the fourth-second wavelength L4-2.

As an example, the fifth wave pattern WP5 may have a fifth-first wavelength L5-1 and a fifth-second wavelength L5-2. The fifth-first wavelength L5-1 may be smaller than the fifth-second wavelength L5-2.

FIGS. 16A to 16D are schematic views illustrating a method of manufacturing the pattern glass shown in FIGS. 8A and 8B.

Figure 16A:
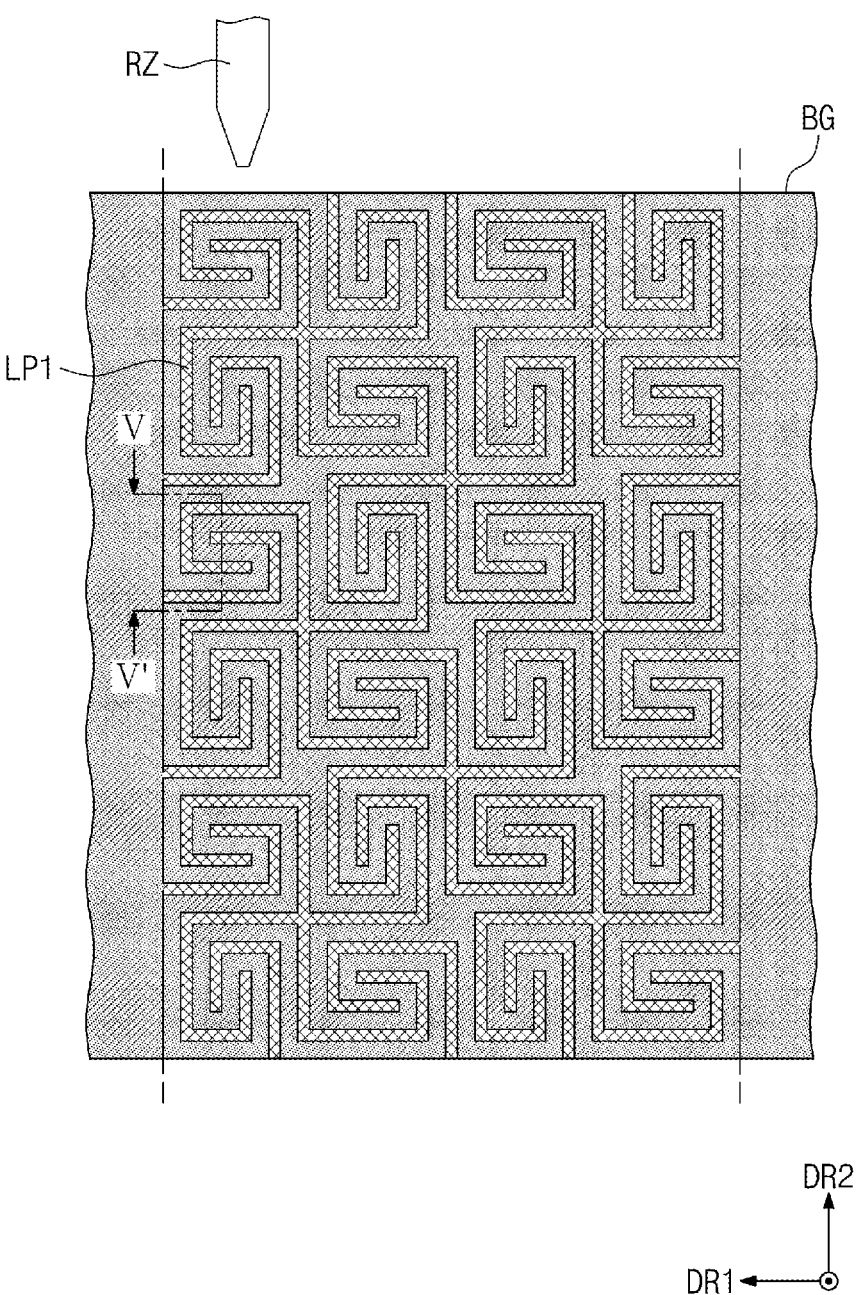
FIGS. 16A to 16D are schematic views illustrating a method of manufacturing a pattern glass shown in FIGS. 8A and 8B.
Figure 16B:
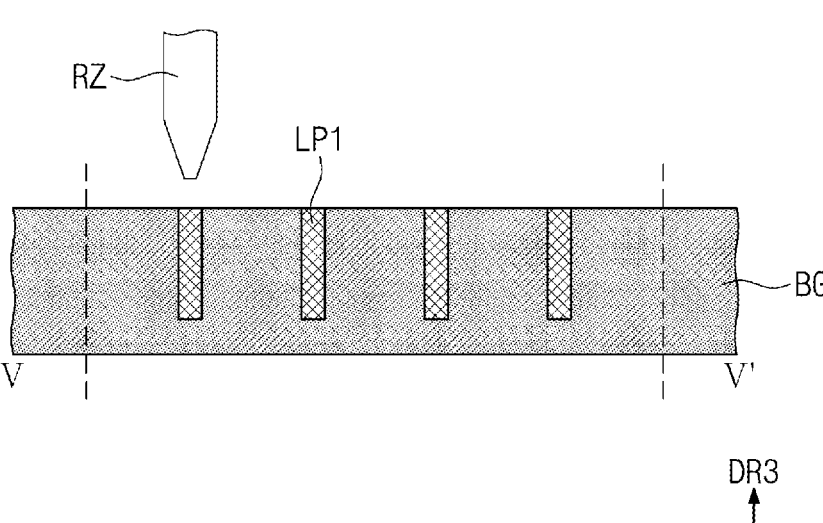
Figure 16C:
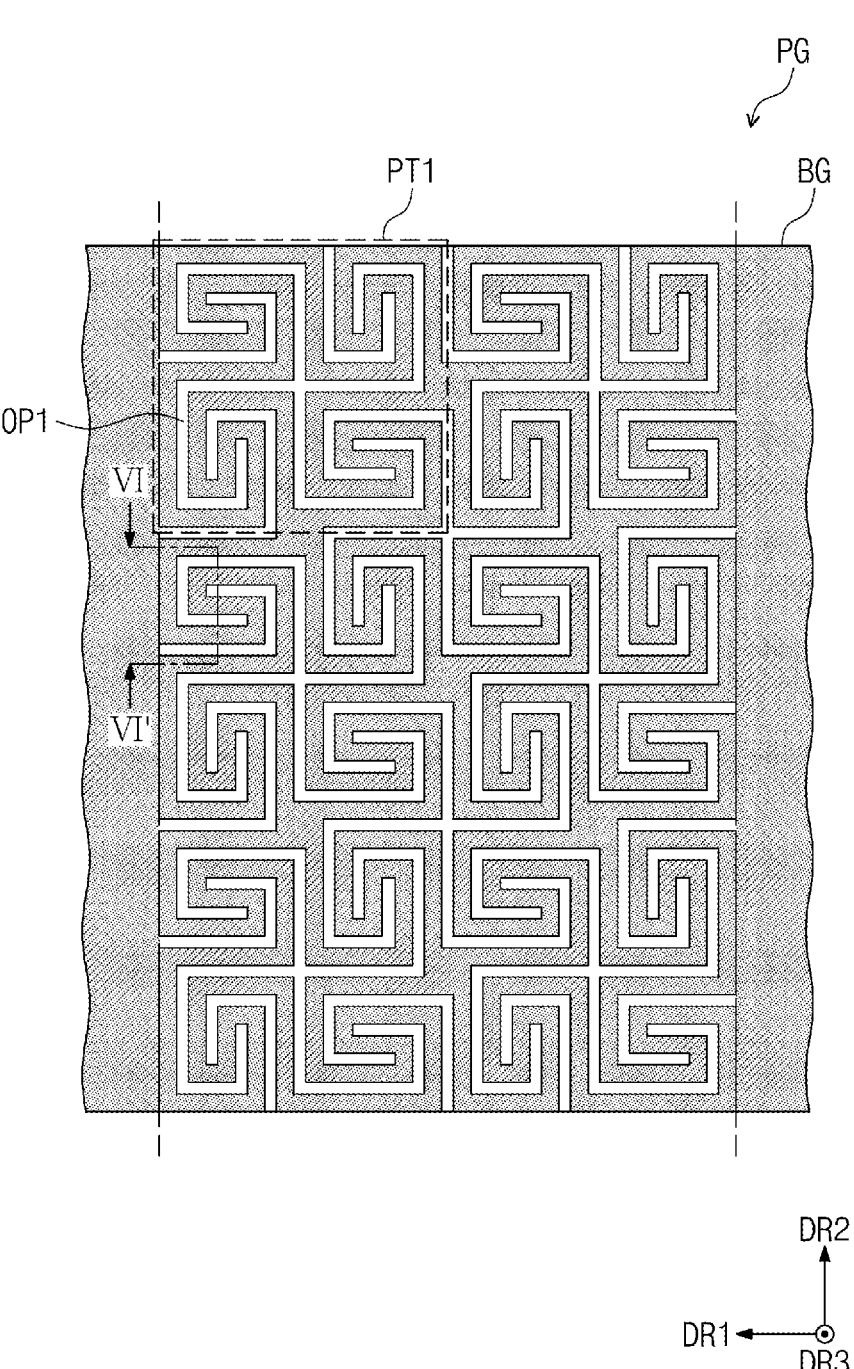
Figure 16D:
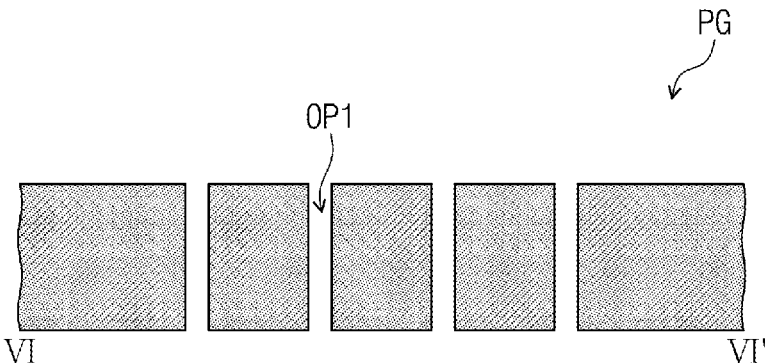

FIGS. 16A and 16C are plan views, FIG. 16B is a cross-sectional view taken along a line V-V' of FIG. 16A, and FIG. 16D is a cross-sectional view taken along line VI-VI' of FIG. 16C.

Referring to FIGS. 16A and 16B, a microwave pulse laser RZ may be irradiated to a surface of a base glass BG to form first laser patterns LP1. In a plan view, the cross-like shape shown in FIG. 8A may be formed.

When viewed in the first direction DR1, the first laser patterns LP1 may have a shape recessed from the surface of the base glass BG. The first laser patterns LP1 may be arranged spaced apart from each other in the second direction DR2.

The microwave pulse laser RZ may be a picosecond laser or a femtosecond laser. The picosecond laser indicates a laser whose wavelength period is in the unit of picoseconds, and the femtosecond laser indicates a laser whose wavelength period is in the unit of femtoseconds.

As the microwave pulse laser RZ is used to form first laser patterns LP1, first laser patterns LP1 may be formed in the form of a deep and narrow groove. In case that the microwave pulse laser RZ is used, an impact applied to the base glass BG may be small, and thus, cracks may not occur around the first laser patterns LP1 even though a laser process is performed.

Referring to FIGS. 16C and 16D, the base glass BG in which the first laser patterns LP1 of FIGS. 16A and 16B are formed may be etched, and the pattern glass PG including the cross-like shape may be formed. The first openings OP1 may be defined through the pattern glass PG. The first openings OP1 may penetrate through the pattern glass PG. In a plan view, the first openings OP1 may extend in the first direction DR1 and the second direction DR2.

An etching solution such as NaOH or KOH may be used in the process of etching the base glass BG.

Although not shown in figures, in case that the etching process is completed, a process of strengthening the pattern glass PG may be performed. A compressive strength of the pattern glass PG may increase by the strengthening process.

FIGS. 17A to 17D are schematic views illustrating a method of manufacturing the pattern glass shown in FIGS. 13A and 13B.

Figure 17A:
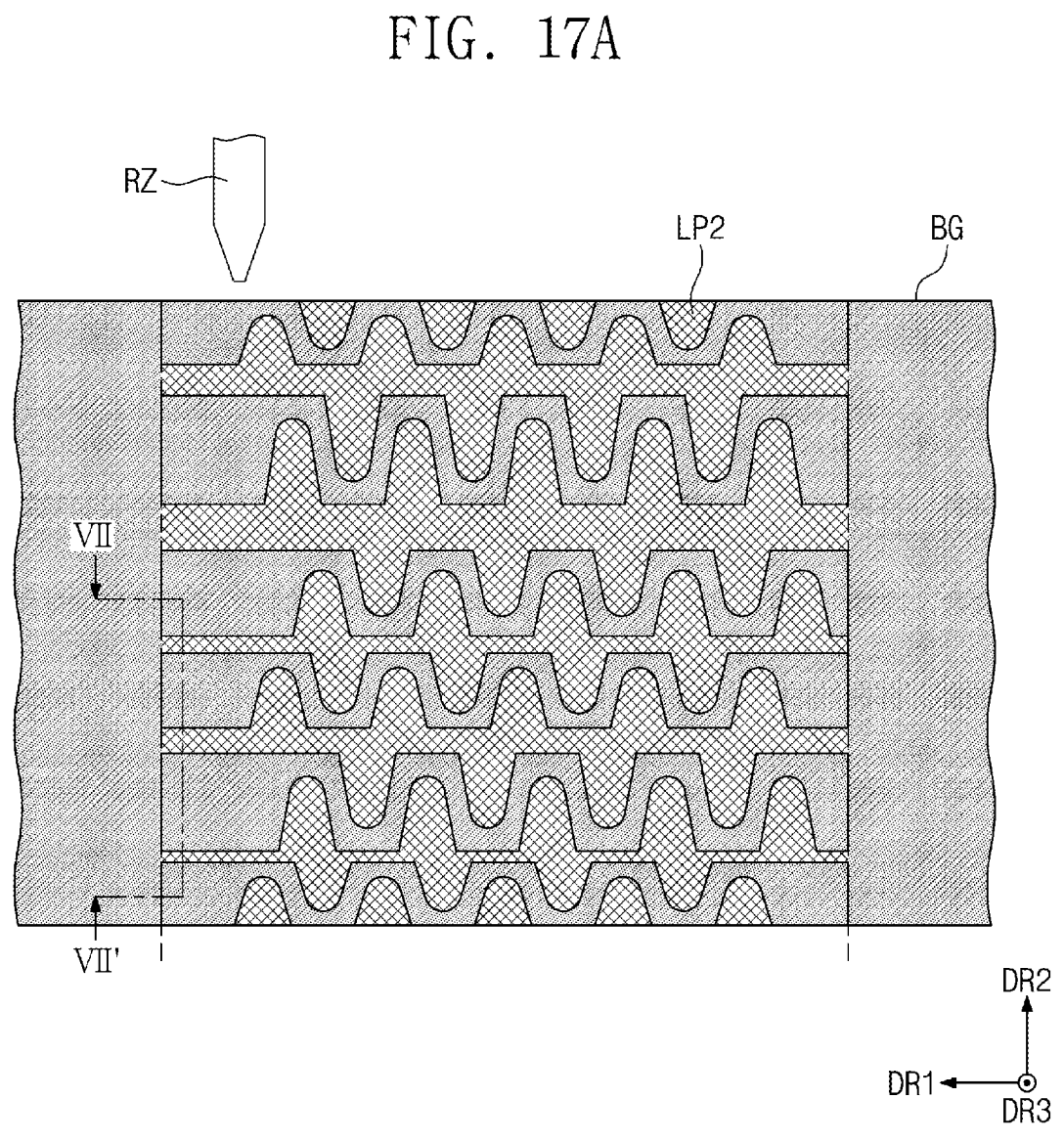
Figure 17B:
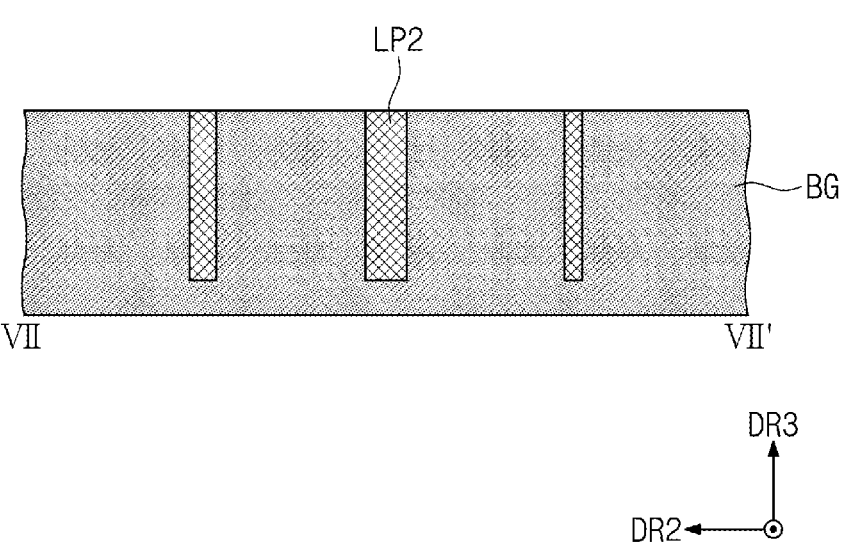
Figure 17C:
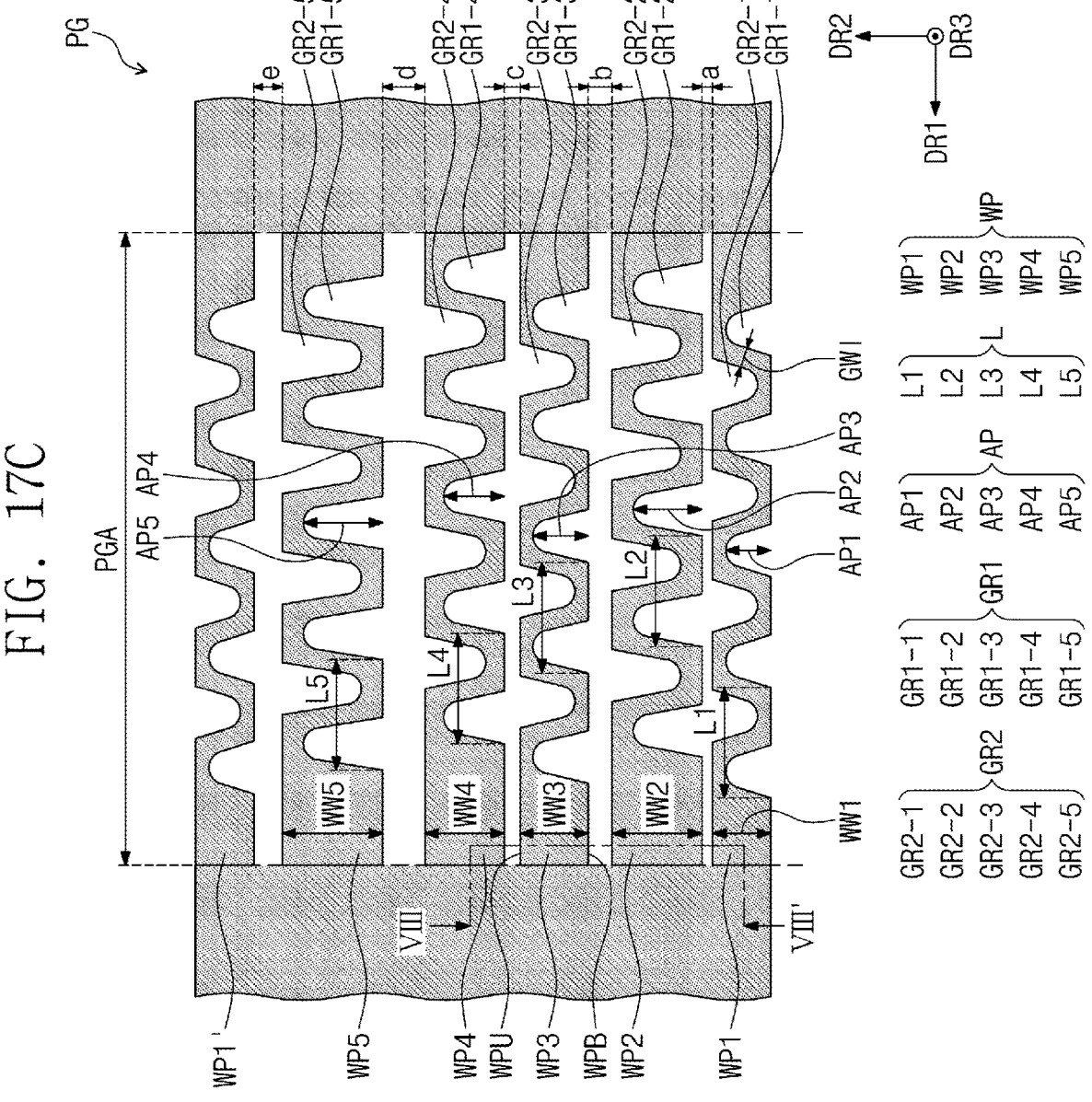
Figure 17D:
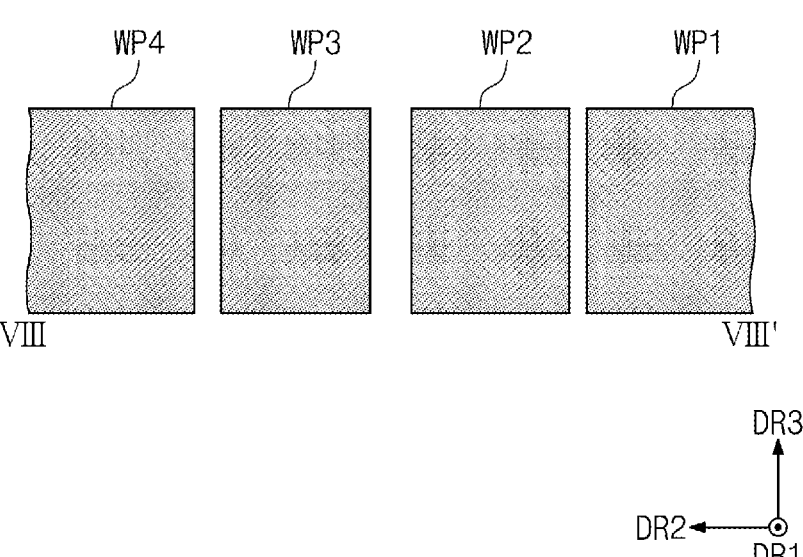

FIGS. 17A and 17C are plan views, FIG. 17B is a cross-sectional view taken along line VII-VII' of FIG. 17A, and FIG. 17D is a cross-sectional view taken along line VIII-VIII' of FIG. 17C.

A microwave pulse laser RZ shown in FIGS. 17A and 17B may be the same as the microwave pulse laser RZ shown in FIGS. 16A and 16B, and thus, details thereof will be omitted.

Referring to FIGS. 17A and 17B, the microwave pulse laser RZ may be irradiated to a surface of a base glass BG to form second laser patterns LP2. In a plan view, the wave patterns WP shown in FIG. 13A may be formed.

When viewed in the first direction DR1, the second laser patterns LP2 may have a shape recessed from the surface of the base glass BG. The second laser patterns LP2 may be arranged spaced apart from each other in the second direction DR2.

Referring to FIGS. 17C and 17D, the base glass BG in which the second laser patterns LP2 shown in FIGS. 17A and 17B are formed may be etched, and the pattern glass PG including the wave patterns WP may be formed. An etching solution such as NaOH or KOH may be used in the process of etching the base glass BG.

In case that the etching process is completed, the wave patterns WP adjacent to each other in the second direction DR2 may be separated from each other in the first direction DR1.

Although not shown in figures, in case that the etching process is completed, a process of strengthening the pattern glass PG may be performed. A compressive strength of the pattern glass PG may increase by the strengthening process.

Although embodiments of the disclosure have been described, it is understood that the disclosure should not be limited to these embodiments but various changes and modifications can be made by one of ordinary skill in the art within the spirit and scope of the disclosure. Therefore, the disclosed subject matter should not be limited to any single embodiment described herein.

What is claimed is:

1. A display device, comprising:
a display panel; and
a pattern glass disposed on the display panel and comprising a first non-pattern portion, a pattern portion, and a second non-pattern portion, which are arranged in a first direction,
wherein the pattern glass is disposed on a front surface of the display panel defining a display surface,
wherein
the pattern portion comprises:
    a plurality of patterns having a shape and arranged in the first direction and a second direction intersecting the first direction; and
    openings defined through the pattern glass between the plurality of patterns adjacent to each other,
    each of the openings has a symmetrical shape with respect to a third direction intersecting a plane defined by the first and second directions based on a symmetry axis extending in the second direction, and
    the symmetry axis passes through a midpoint of a thickness of the pattern glass.

2. The display device of claim 1, wherein the openings have a shape corresponding to the plurality of patterns in a plan view.

3. The display device of claim 2, wherein
the plurality of patterns are repeatedly arranged, and are not separated from each other, and
each of the plurality of patterns has a same shape.

4. The display device of claim 3, wherein the shape of each of the plurality of patterns has at least one of a cross-like shape, a snow crystal shape, a scale shape, a pinwheel shape, a spiral shape, an octagonal shape, or a column shape.

5. The display device of claim 4, wherein
the openings have a straight line shape alternately extending in the first direction and the second direction in the plan view, and
each of the openings has a width within a range of about 5 micrometers to about 10 micrometers.

6. The display device of claim 3, wherein
the shape of each of the plurality of patterns has a spiral shape in the plan view, and
the openings have a curved shape in the plan view.

7. The display device of claim 2, wherein
the plurality of patterns have wave patterns arranged in a plurality of rows, and
the plurality of rows correspond to the second direction.

8. The display device of claim 7, wherein
each of the wave patterns have a length within a range of about 0.625 mm to about 1.125 mm in the second direction, and
lengths in the second direction of the wave patterns are different from each other.

9. The display device of claim 7, wherein
a distance between the wave patterns adjacent to each other in the second direction is within a range of about 10 micrometers to about 200 micrometers, and
distances between the wave patterns adjacent to each other are different from each other.

10. The display device of claim 9, wherein the wave patterns adjacent to each other in the second direction have different wavelengths from each other.

11. The display device of claim 9, wherein at least one wave pattern among the wave patterns has a uniform wavelength.

12. The display device of claim 9, wherein wavelengths of the wave patterns vary.

13. The display device of claim 1, wherein
inner side surfaces of the pattern portion are defined by surfaces of the plurality of patterns facing each other to define the openings, and
the inner side surfaces of the pattern portion have a straight line shape extending in the third direction when viewed in the first direction.

14. The display device of claim 1, wherein
inner side surfaces of the pattern portion are defined by surfaces of the plurality of patterns facing each other to define the openings, and
the inner side surfaces of the pattern portion have a convex shape toward the openings when viewed in the first direction.

15. The display device of claim 14, wherein the pattern portion further comprises:
first slant surfaces connecting the inner side surfaces of the pattern portion and an upper surface of the pattern portion when viewed in the first direction; and
second slant surfaces connecting the inner side surfaces of the pattern portion and a lower surface of the pattern portion when viewed in the first direction.

16. The display device of claim 1, wherein the openings have a tapered shape in which a width of the openings increases from a midpoint of a thickness of the pattern portion to an upper surface or a lower surface of the pattern portion when viewed in the first direction.

17. A display device, comprising:
a display panel; and
a pattern glass disposed on the display panel and comprising a first non-pattern portion, a pattern portion, and a second non-pattern portion, which are arranged in a first direction, wherein
the pattern portion comprises:
    a plurality of patterns having a shape, arranged in the first direction and a second direction intersecting the first direction in a plan view, and having a wave pattern; and
    openings defined through the pattern glass between the plurality of patterns adjacent to each other in the second direction, and the plurality of patterns which have the wave pattern have different amplitudes from each other in a plan view.

18. The display device of claim 17, wherein each of the openings has a symmetrical shape with respect to a third direction intersecting a plane defined by the first and second directions based on a symmetry axis extending in the second direction.

19. The display device of claim 17, wherein at least one pattern of the plurality of patterns has a uniform wavelength and extends in the first direction.

20. The display device of claim 17, wherein a first amplitude value varies from a second amplitude value in each of the plurality of patterns.

21. An electronic device comprising a display device for providing an image, wherein the display device comprises:

a display panel; and a pattern glass disposed on the display panel and comprising a first non-pattern portion, a pattern portion, and a second non-pattern portion, which are arranged in a first direction, wherein the pattern glass is disposed on a front surface of the display panel defining a display surface, wherein the pattern portion comprises:

a plurality of patterns having a shape and arranged in the first direction and a second direction intersecting the first direction; and openings defined through the pattern glass between the plurality of patterns adjacent to each other, each of the openings has a symmetrical shape with respect to a third direction intersecting a plane defined by the first and second directions based on a symmetry axis extending in the second direction, and the symmetry axis passes through a midpoint of a thickness of the pattern glass.

* * * * *